(12) United States Patent
Tsai et al.

(10) Patent No.: US 10,868,129 B2
(45) Date of Patent: Dec. 15, 2020

(54) GATE SPACER AND METHODS OF FORMING

(71) Applicant: Taiwan Semiconductor Manufacturing Company, Ltd., Hsinchu (TW)

(72) Inventors: Chun Hsiung Tsai, Xinpu Township (TW); Kuo-Feng Yu, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/568,767

(22) Filed: Sep. 12, 2019

(65) Prior Publication Data

US 2020/0006512 A1    Jan. 2, 2020

Related U.S. Application Data

(62) Division of application No. 15/437,124, filed on Feb. 20, 2017, now Pat. No. 10,522,641, which is a
(Continued)

(51) Int. Cl.
*H01L 29/49* (2006.01)
*H01L 29/66* (2006.01)
(Continued)

(52) U.S. Cl.
CPC ...... *H01L 29/4983* (2013.01); *H01L 21/0206* (2013.01); *H01L 21/02252* (2013.01); *H01L 21/02255* (2013.01); *H01L 21/28247* (2013.01); *H01L 21/3105* (2013.01); *H01L 21/31111* (2013.01); *H01L 21/823468* (2013.01); *H01L 21/823814* (2013.01); *H01L 21/823864* (2013.01); *H01L 29/6653* (2013.01);
(Continued)

(58) Field of Classification Search
CPC ............. H01L 29/4983; H01L 21/3105; H01L 21/823864; H01L 29/6656; H01L 29/6653; H01L 21/823468
See application file for complete search history.

(56) References Cited

U.S. PATENT DOCUMENTS

| 6,372,644 B1 | 4/2002 | Foster et al. |
| 6,387,804 B1 | 5/2002 | Foster |

(Continued)

FOREIGN PATENT DOCUMENTS

| CN | 101304043 A | 11/2008 |
| CN | 101908506 A | 12/2010 |

(Continued)

*Primary Examiner* — Selim U Ahmed
*Assistant Examiner* — Evan G Clinton
(74) *Attorney, Agent, or Firm* — Slater Matsil, LLP

(57) ABSTRACT

Methods and structures for forming devices, such as transistors, are discussed. A method embodiment includes forming a gate spacer along a sidewall of a gate stack on a substrate; passivating at least a portion of an exterior surface of the gate spacer; and epitaxially growing a material in the substrate proximate the gate spacer while the at least the portion of the exterior surface of the gate spacer remains passivated. The passivating can include using at least one of a thermal treatment, a plasma treatment, or a thermal treatment.

20 Claims, 30 Drawing Sheets

Related U.S. Application Data division of application No. 14/555,311, filed on Nov. 26, 2014, now Pat. No. 9,577,070.

(51) Int. Cl.
*H01L 29/78* (2006.01)
*H01L 21/02* (2006.01)
*H01L 21/311* (2006.01)
*H01L 21/8234* (2006.01)
*H01L 21/8238* (2006.01)
*H01L 21/3105* (2006.01)
*H01L 21/28* (2006.01)
*H01L 29/165* (2006.01)

(52) U.S. Cl.
CPC ...... *H01L 29/6656* (2013.01); *H01L 29/6659* (2013.01); *H01L 29/66575* (2013.01); *H01L 29/66636* (2013.01); *H01L 29/7833* (2013.01); *H01L 29/7848* (2013.01); *H01L 29/165* (2013.01)

(56) References Cited

U.S. PATENT DOCUMENTS

| | | |
|---|---|---|
| 2005/0112817 A1 | 5/2005 | Cheng et al. |
| 2008/0026518 A1 | 1/2008 | Su et al. |
| 2008/0061366 A1 | 3/2008 | Liu et al. |
| 2010/0173496 A1* | 7/2010 | Zhong ................. H01L 29/6656 438/696 |
| 2010/0308379 A1 | 12/2010 | Kuan et al. |
| 2012/0032227 A1 | 2/2012 | Seabaugh et al. |
| 2014/0264444 A1 | 9/2014 | Guo et al. |

FOREIGN PATENT DOCUMENTS

| | | |
|---|---|---|
| EP | 0460429 A2 | 12/1991 |
| KR | 1020070089073 A | 8/2007 |

* cited by examiner

GATE SPACER AND METHODS OF FORMING

PRIORITY CLAIM AND CROSS-REFERENCE

This application is a divisional of U.S. patent application Ser. No. 15/437,124, entitled "Gate Spacers and Methods of Forming," filed on Feb. 20, 2017, which is a divisional of U.S. patent application Ser. No. 14/555,311, filed on Nov. 26, 2014, now U.S. Pat. No. 9,577,070, issued on Feb. 21, 2017, entitled "Gate Spacers and Methods of Forming," which applications are hereby incorporated herein by reference.

BACKGROUND

The semiconductor integrated circuit (IC) industry has experienced rapid growth. In addition to increases in functional density (e.g., the number of interconnected devices per chip area) and decreases in geometry size (e.g., the smallest component that can be created using a fabrication process), device speed is continuously increasing. The scaling down process for density increases and size decreases can aid increases in device speed since signal propagation may be through shorter structures.

Other approaches to increasing device speed have been advanced. One approach includes the incorporation of dissimilar materials in a device. For example, a material different from a material of a substrate may be epitaxially grown for source/drain regions of a transistor, such as a field effect transistor (FET). Use of the dissimilar material can increase carrier mobility in the transistor, thereby increasing the speed of operation of the device.

With the increased usage of dissimilar materials in devices and the decreased geometry size, new problems have arisen that may not have been detectable in devices with a larger size or may not have affected those devices with a larger size. It is within this context the following disclosure arises.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
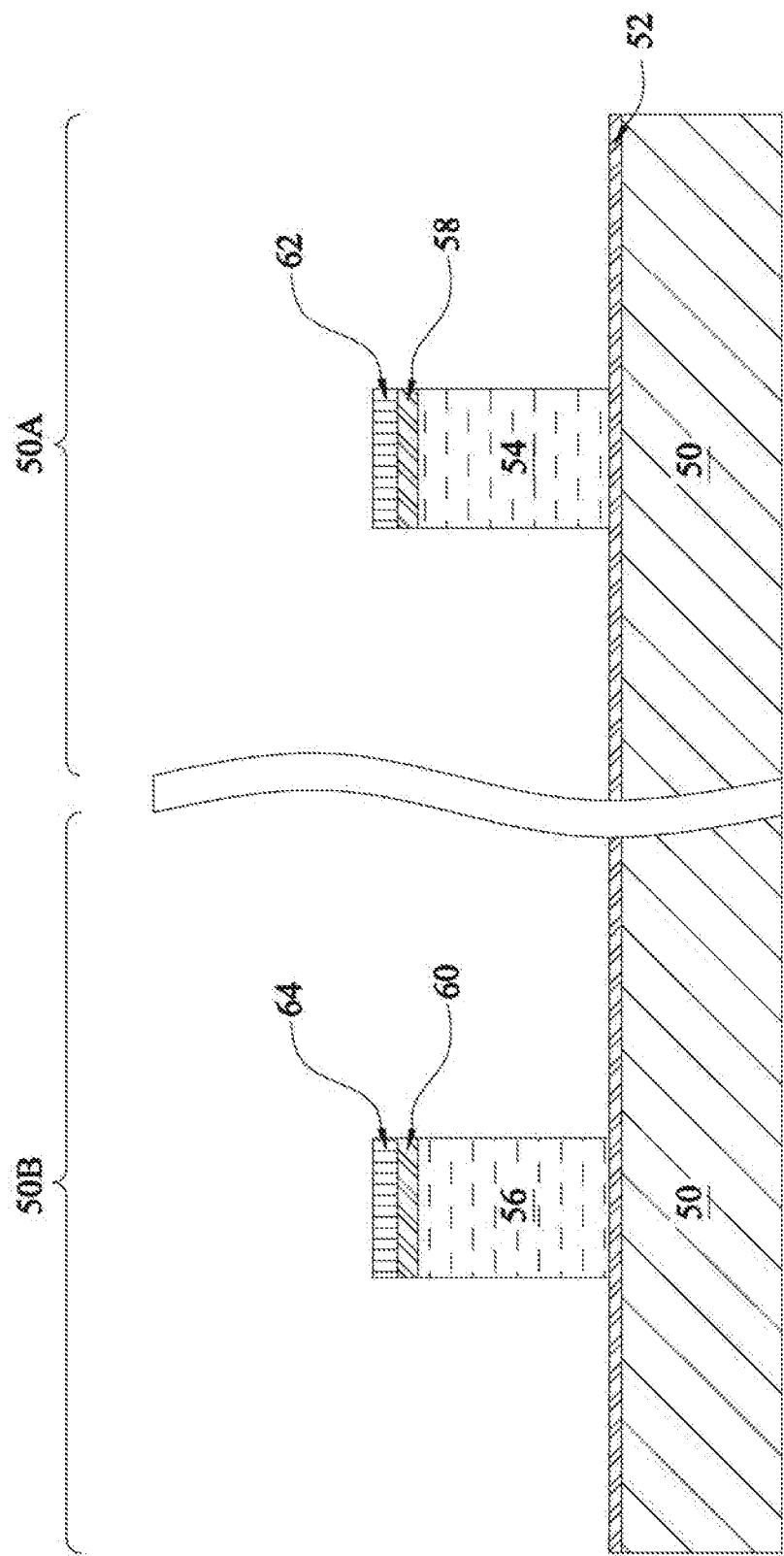
FIGS. 1 through 17 illustrate cross sectional views of intermediate stages of a first method to manufacture devices in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely the formation of semiconductor devices, such as transistors like field effect transistors (FETs). More specifically, some embodiments relate to formation of gate spacers on gates of FETs. It should be noted that embodiments discussed herein may not necessarily illustrate every component or feature that may be present in a structure. For example, multiples of a component may be omitted from a figure, such as when discussion of one of the components may be sufficient to convey aspects of the embodiment. Further, method embodiments discussed herein may be discussed as being performed in a particular order; however, other method embodiments may be performed in any logical order.

FIGS. 1 through 17 illustrate cross sectional views of intermediate stages of a method to manufacture devices in accordance with some embodiments. FIG. 1 illustrates a first gate stack in a first region 50A of a substrate 50 and a second gate stack in a second region 50B of the substrate 50. The substrate 50 may be a bulk semiconductor substrate, a semiconductor-on-insulator (SOI) substrate, a multi-layered or gradient substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. In some embodiments, the semiconductor material of the substrate 50 may include an elemental semiconductor such as silicon, germanium, or the like; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The first region 50A can be for forming n-type devices, such as NMOS transistors, such as n-type finFETs, and the second region 50B can be for forming p-type devices, such as PMOS transistors, such as p-type finFETs. The illustration of the substrate 50 in FIG. 1 can be a cross section of a planar substrate for forming planar devices, such as planar transistors, or can be a cross section of a fin formed in the substrate 50 for forming fin-type devices, such as finFETs.

A gate dielectric layer 52 is formed on a surface of the substrate 50 in the first region 50A and the second region 50B. The gate dielectric layer 52 can be any acceptable dielectric layer, such as silicon oxide, silicon nitride, the like, or a combination thereof, and may be formed using any acceptable process, such as thermal oxidation, a spin process, a chemical vapor deposition (CVD), or the like. A gate electrode layer is formed on the gate dielectric layer 52. The gate electrode layer can be any acceptable electrode layer, such as comprising polysilicon, a metal, the like, or a combination thereof. The gate electrode layer can be deposited by any acceptable deposition process, such as a CVD, a plasma enhanced CVD (PECVD), or the like. An anti-reflection coating (ARC) is formed on the gate electrode layer. The ARC may be any acceptable ARC, such as silicon oxide, silicon oxynitride, the like, or a combination thereof, and may be deposited by any acceptable deposition process, such as CVD, PECVD, or the like. A hardmask layer is formed on the ARC. The hardmask may be any acceptable masking layer, such as silicon nitride, silicon carbon nitride, the like, or a combination thereof, and may be deposited by any acceptable deposition process, such as CVD, PECVD, or the like. The hardmask layer, ARC, and gate electrode layer are then patterned into the first gate stack and the second gate stack, such as by using any acceptable photolithography and etching processes. The first gate stack in the first region 50A comprises a gate electrode 54, an ARC 58, and a hardmask 62, and the second gate stack in the second region 50B comprises a gate electrode 56, an ARC 60, and a hardmask 64.

Figure 2:
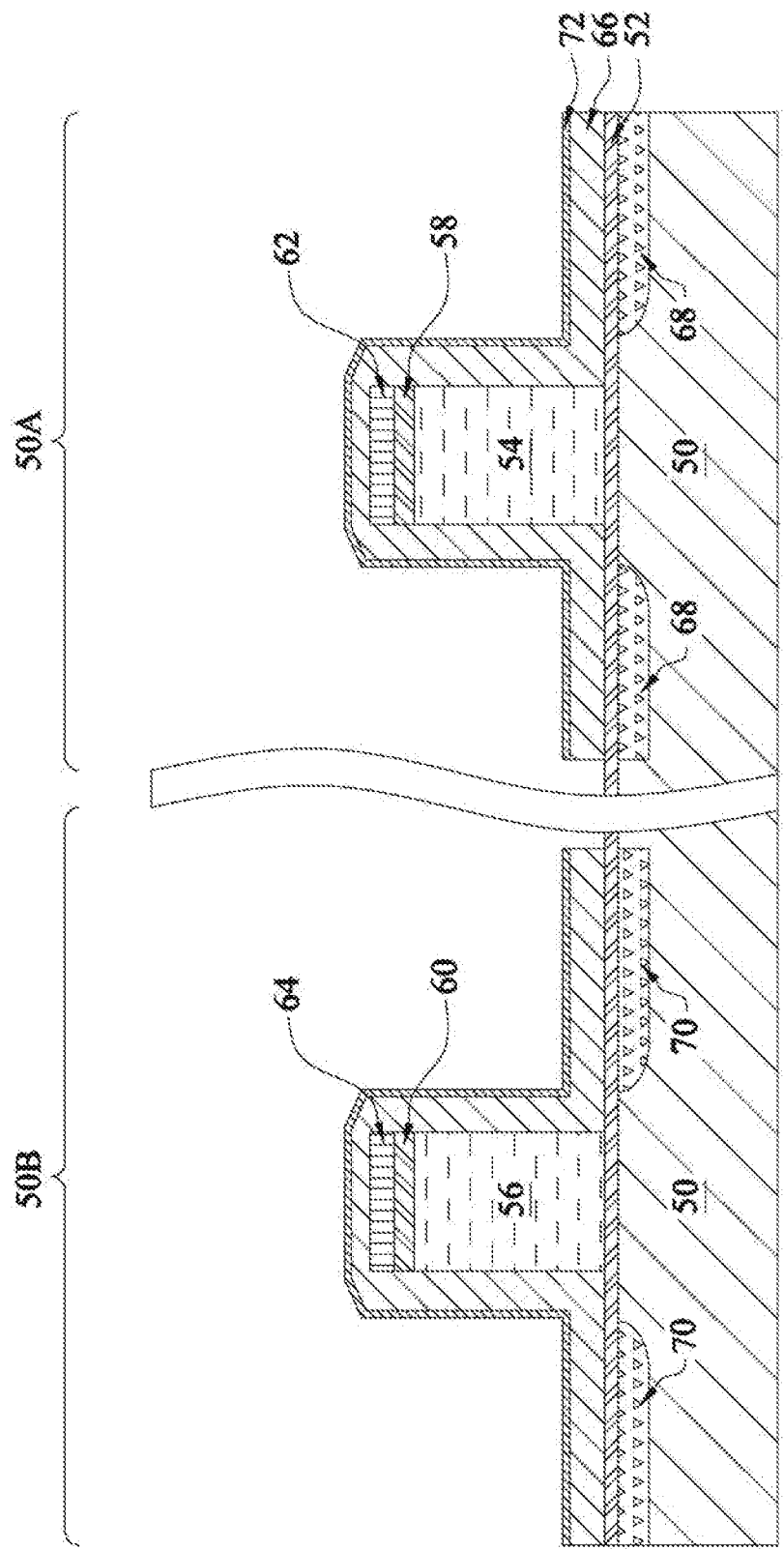

In FIG. 2, a seal layer 66, low doped source/drain (LDD) regions 68 and 70, and a first passivation layer 72 are formed. The seal layer 66 can be silicon oxycarbonnitride (SiOCN), silicon nitride (SiN), silicon carbonnitride (SiCN), or the like, and can be deposited by atomic layer deposition (ALD), CVD, plasma enhanced ALD (PEALD), or the like. The seal layer 66 is formed conformally on the substrate 50, the first gate stack in the first region 50A, and the second gate stack in the second region 50B. The seal layer 66 can have a substantially uniform thickness in a direction orthogonal to a corresponding underlying surface, which may be between about 1 nm and about 10 nm, such as about 5 nm.

Implants to form the LDD regions 68 and 70 may be performed. A mask may be formed over the second region 50B, e.g., PMOS region, while exposing the first region 50A, e.g., NMOS region. The mask may be a photoresist formed, for example, by spin coating and patterned by a photolithography technique. N-type impurities may be implanted into the substrate 50 in the first region 50A. The mask may prevent the n-type impurities from being implanted into the second region 50B, and the first gate stack and seal layer 66 may also act as a mask and cause the LDD regions 68 in first region 50A to be self-aligned to the first gate stack. The mask may then be removed, such as by an ashing or stripping process when the mask is a photoresist. Similarly, a mask, such as a photoresist, may be formed over the first region 50A while exposing the second region 50B, and p-type impurities may be implanted into the substrate 50 in the second region 50B. The mask may prevent the p-type impurities from being implanted into the first region 50A, and the second gate stack and seal layer 66 may also act as a mask and cause the LDD regions 70 in second region 50B to be self-aligned to the second gate stack. The mask may then be removed. The n-type impurities may be phosphorus, arsenic, or the like, and the p-type impurities may be boron, $BF_2$, or the like. The LDD regions 68 and 70 may have a concentration of impurities from about $10^{15}$ $cm^{-3}$ to about $10^{16}$ $cm^{-3}$. An anneal may be used to activate the implanted impurities.

The first passivation layer 72 is formed on exterior surfaces of the seal layer 66. The first passivation layer 72 may be formed by performing an appropriate treatment on the seal layer 66 to passivate dangling bonds of the seal layer 66. In some embodiments, the treatment may be a wet treatment, a plasma treatment, a thermal treatment, or a combination thereof.

In some embodiments, a wet treatment comprises a standard clean-2 (SC2) followed with a standard clean-1 (SC1), where the SC2 is a mixture of deionized (DI) water, hydrochloric (HCl) acid, and hydrogen peroxide ($H_2O_2$) at a mixture ratio of 5:1:1 of DI:HCl:$H_2O_2$, and the SC1 is a mixture of DI water, ammonium hydroxide ($NH_4OH$), and hydrogen peroxide ($H_2O_2$) at a mixture ratio of 5:1:1 of DI:$NH_4OH$:$H_2O_2$. In other embodiments, an isopropyl alcohol (IPA) can be used after the SC1. A wet treatment may omit any chemical, such as hydrofluoric (HF) acid, that might remove a passivating species that would form the first passivation layer 72.

In other embodiments, a plasma treatment comprises a plasma using a gas of oxygen ($O_2$), ozone ($O_3$), ammonium hydroxide ($NH_4OH$), steam ($H_2O$), tetrafluoromethane ($CF_4$), sulfur hexfluoride ($SF_6$), chlorine ($Cl_2$), hydrochloric acid (HCl), the like, or a combination thereof. The plasma process can be at a pressure of between about 5 mTorr and about 600 mTorr, at a power between about 20 W and about 200 W with a frequency between about 2 MHz and about 13.56 MHz, and with a flow rate of gas between about 10 sccm and about 100 sccm. The seal layer 66 may be directly exposed to the plasma for a duration between about 10 seconds and about 120 seconds.

In further embodiments, a thermal process comprises an environment comprising oxygen ($O_2$), ozone ($O_3$), steam ($H_2O$), the like, or a combination thereof. The environment may be at a temperature between about 25° C. and about 350° C. The seal layer 66 may be exposed to the environment for a duration between about 10 seconds and about 120 seconds.

The treatment can terminate dangling bonds of the seal layer 66 to form the first passivation layer 72. The first passivation layer 72 may be a monolayer, e.g., a layer with a thickness of substantially one atom and/or molecule. In some embodiments, the first passivation layer 72 can have a thickness between about 3 Å and about 20 Å, such as about 10 Å. A terminating species of the treatment can be —O, —OH, —F, —Cl, the like, or a combination thereof. The first passivation layer 72 may be an oxide, a fluoride, or the like of the seal layer 66. For example, when the seal layer 66 is silicon oxycarbonnitride (SiOCN), the first passivation layer 72 may be oxygen-rich silicon oxycarbonnitride (SiOCN). In some embodiments, the first passivation layer 72 is not formed.

Figure 3:
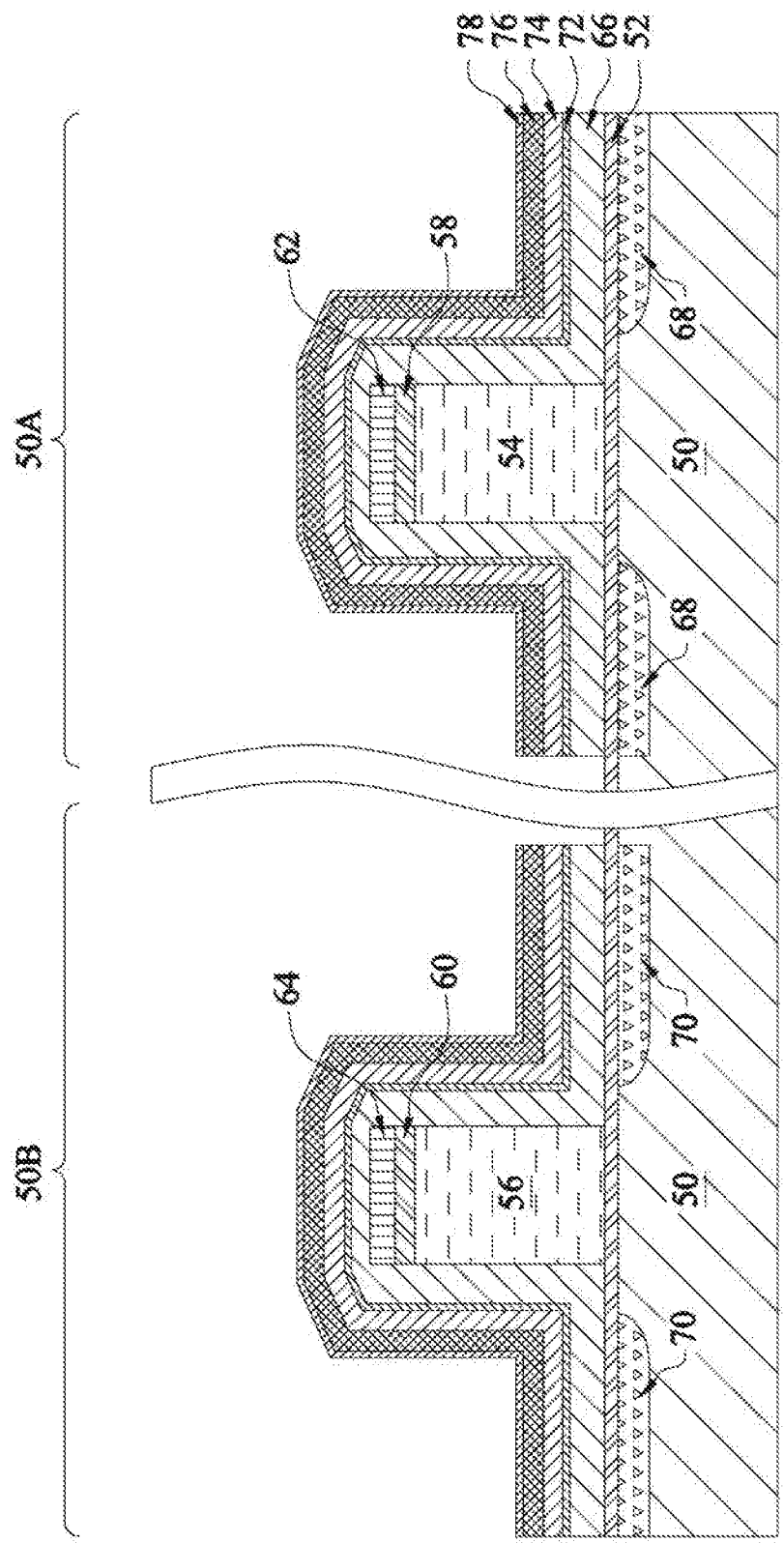

In FIG. 3, an offset structured layer is formed on the first passivation layer 72. The offset structured layer comprises a first sub-layer 74 on the passivation layer and a second sub-layer 76 on the first sub-layer 74. The first sub-layer 74 can be silicon oxycarbonnitride (SiOCN), silicon nitride (SiN), silicon carbonnitride (SiCN), or the like, and can be deposited by ALD, CVD, PEALD, or the like. The second sub-layer 76 can be silicon oxycarbonnitride (SiCON), silicon nitride (SiN), silicon carbonnitride (SiCN), or the like, and can be deposited by ALD, CVD, PEALD, or the like. Each of the first sub-layer 74 and the second sub-layer 76 is formed conformally on the first passivation layer 72 and the first sub-layer 74, respectively. The first sub-layer 74 can have a substantially uniform thickness in a direction orthogonal to a corresponding underlying surface, which may be between about 1 nm and about 10 nm, such as about 5 nm. The second sub-layer 76 can have a substantially uniform thickness in a direction orthogonal to a corresponding underlying surface, which may be between about 1 nm and about 10 nm, such as about 5 nm. The offset structured layer can have a substantially uniform thickness in a direction orthogonal to a corresponding underlying surface.

A second passivation layer 78 is formed on the offset structured layer, e.g., the second sub-layer 76. The second passivation layer 78 is formed on exterior surfaces of the second sub-layer 76. The second passivation layer 78 may be formed by performing an appropriate treatment on the second sub-layer 76 to passivate dangling bonds of the second sub-layer 76. In some embodiments, the treatment may be a wet treatment, a plasma treatment, a thermal treatment, or a combination thereof, such as the treatments discussed above in forming the first passivation layer 72. The treatment can terminate dangling bonds of the second sub-layer 76 to form the second passivation layer 78. The second passivation layer 78 may be a monolayer, e.g., a layer with a thickness of substantially one atom and/or molecule. In some embodiments, the second passivation layer 78 can have a thickness between about 3 Å and about 20 Å, such as about 10 Å. A terminating species of the treatment can be —O, —OH, —F, —Cl, the like, or a combination thereof. The second passivation layer 78 may be an oxide, a fluoride, or the like of the second sub-layer 76. For example, when the second sub-layer 76 is silicon carbonnitride (SiCN), the second passivation layer 78 may be oxygen-rich silicon carbon nitride or silicon oxycarbonnitride (SiOCN). In some embodiments, the second passivation layer 78 is not formed.

Figure 4:
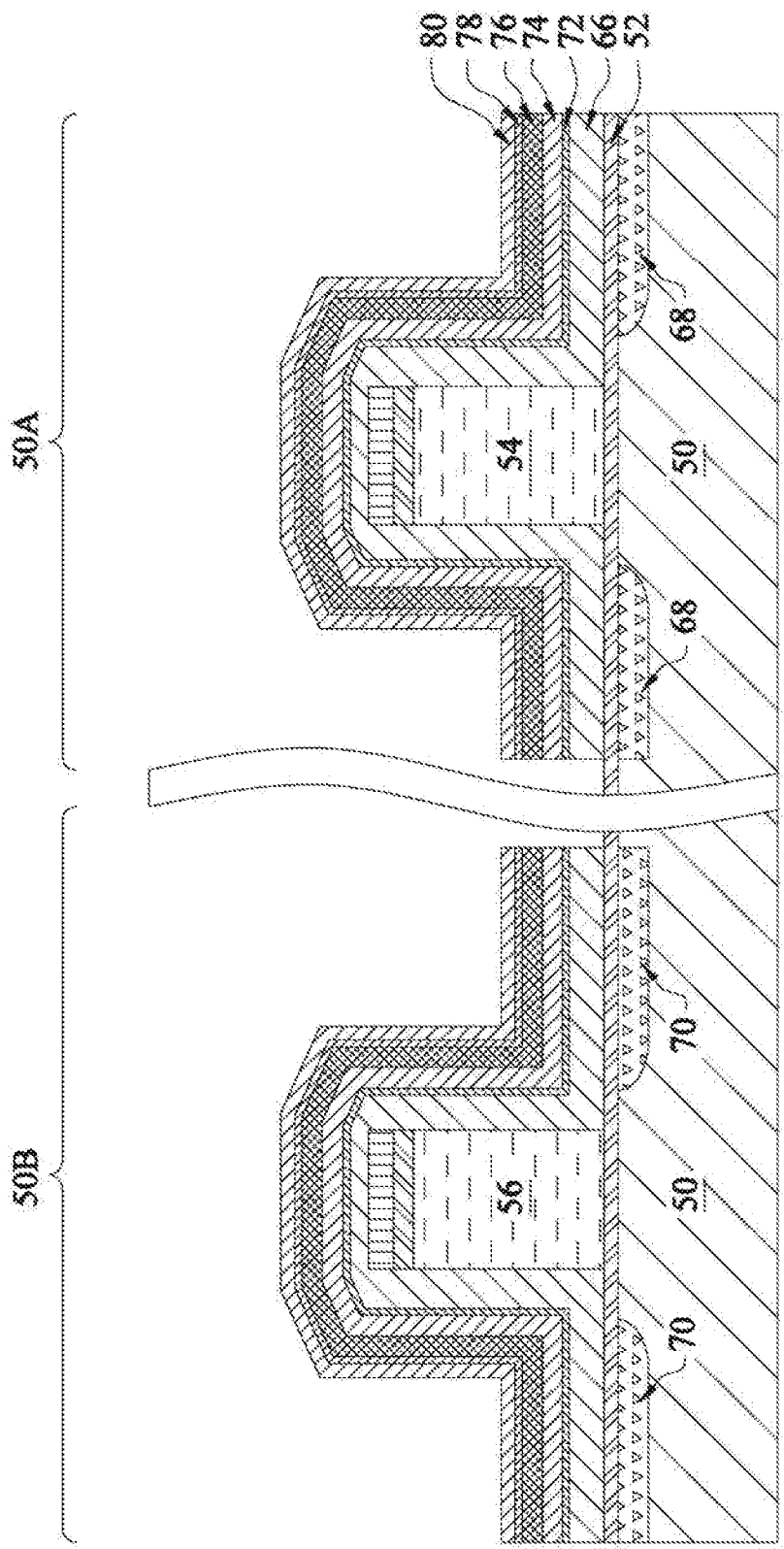

In FIG. 4, a first dummy layer 80 is formed on the second passivation layer 78. The first dummy layer 80 can be silicon nitride (SiN), silicon carbonnitride (SiCN), or the like, and can be deposited by ALD, CVD, PEALD, or the like. The first dummy layer 80 is formed conformally on the second passivation layer 78. The first dummy layer 80 can have a substantially uniform thickness in a direction orthogonal to a corresponding underlying surface, which may be between about 1 nm and about 10 nm, such as about 5 nm.

Figure 5:
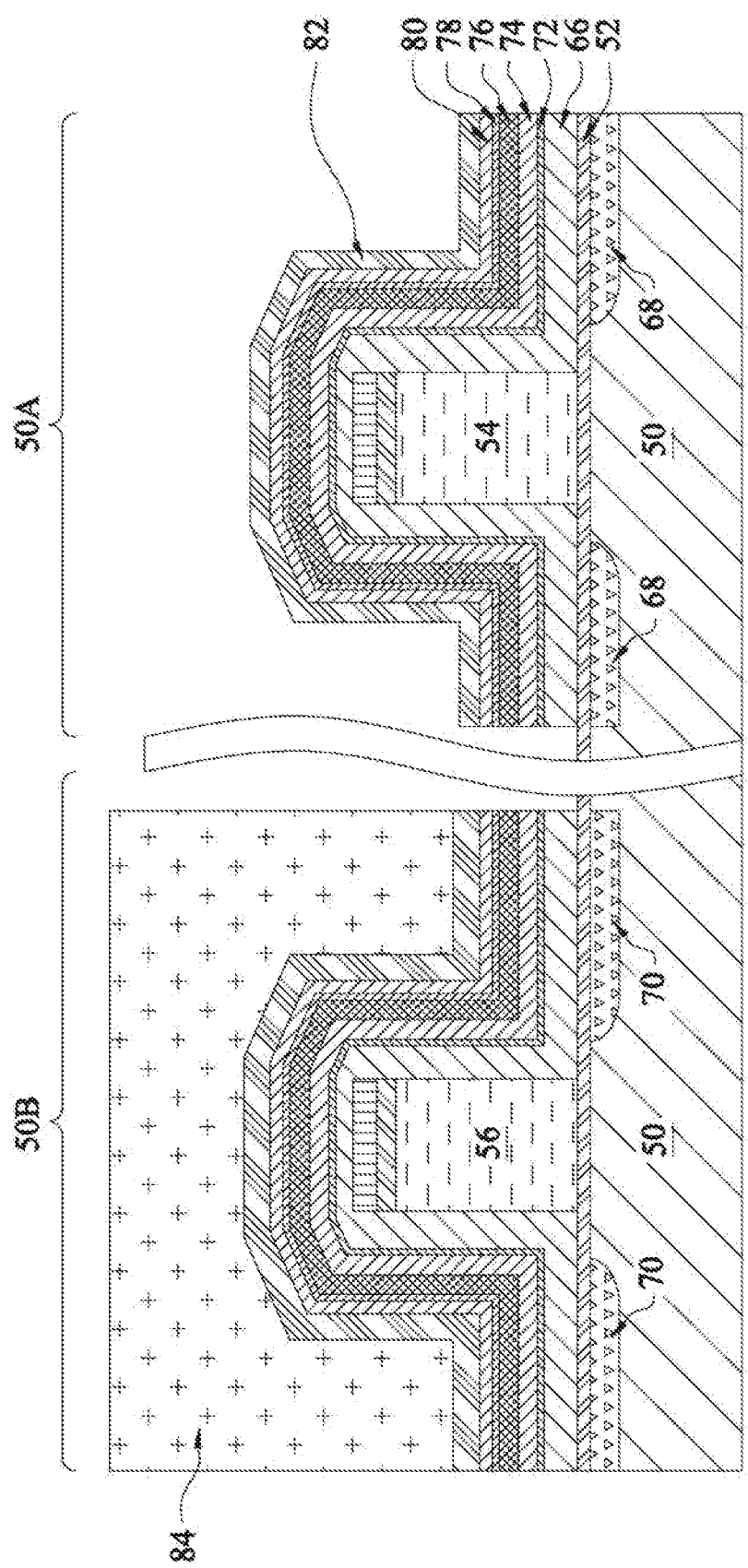

In FIG. 5, a bottom anti-reflection coating (BARC) 82 is formed on the first dummy layer 80. The BARC 82 can be a silicon oxide, silicon oxynitride, or the like, and can be deposited by ALD, CVD, or the like. FIG. 5 further illustrates a mask 84 formed on the BARC 82 in the second region 50B, e.g., PMOS region, of the substrate 50. The mask may be a photoresist formed, for example, by spin coating and patterned by a photolithography technique.

Figure 6:
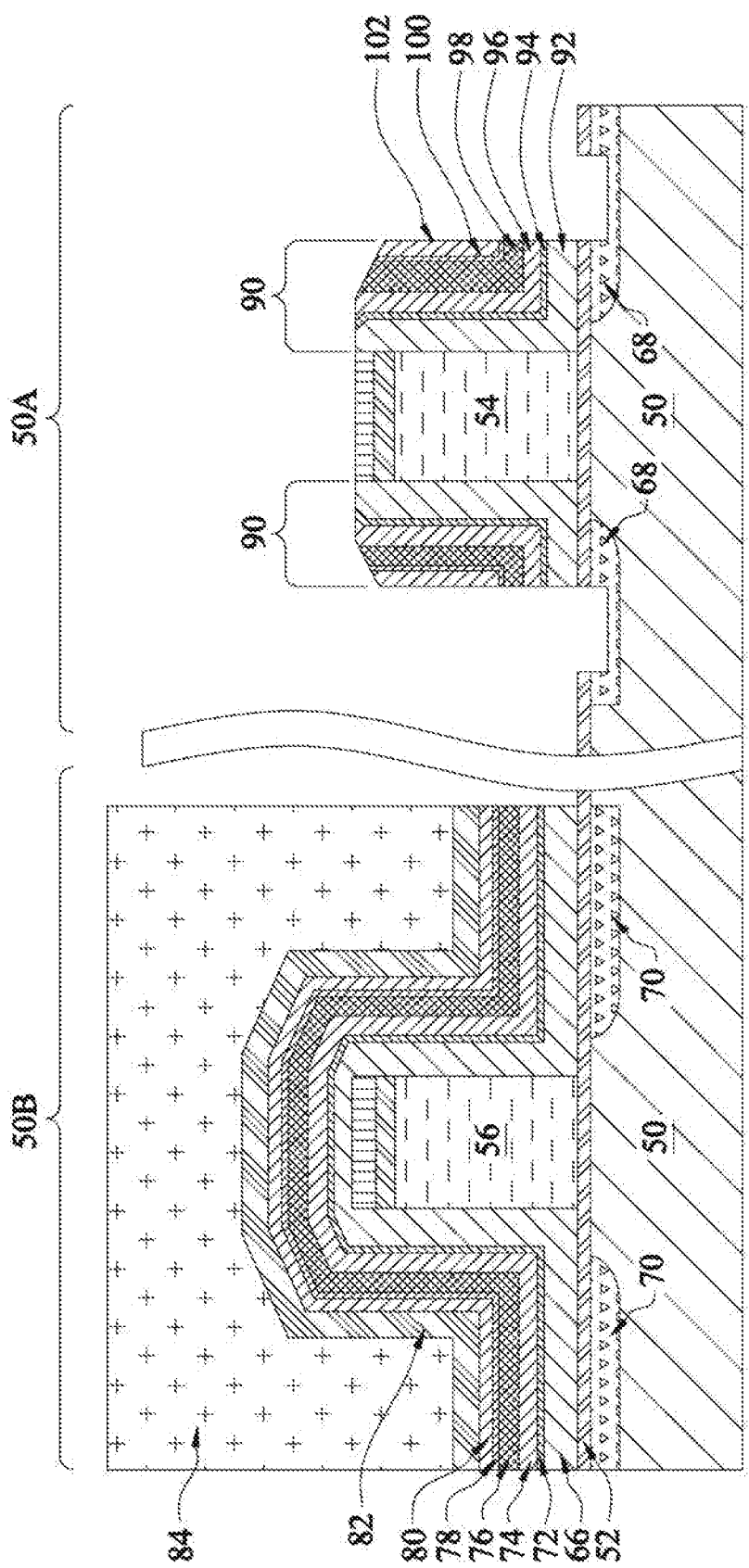

In FIG. 6, the BARC 82 in the first region 50A is removed, and the seal layer 66, first passivation layer 72, first sub-layer 74, second sub-layer 76, second passivation layer 78, and first dummy layer 80 in the first region 50A are etched. The mask 84 in the second region 50B functions to prevent the layers in the second region 50B from being removed or etched during these steps. The BARC 82 is removed from the first region 50A using, for example, an etch that is selective to the BARC 82, which may be isotropic and/or a wet etch. Once the BARC 82 is removed from the first region 50A, an anisotropic etch is performed to etch the seal layer 66, first passivation layer 72, first sub-layer 74, second sub-layer 76, second passivation layer 78, and first dummy layer 80 in the first region 50A. First gate spacers 90 are formed along sidewalls of the first gate stack in the first region 50A as a result of the anisotropic etch. The anisotropic etch can be any acceptable etch process, such as reactive ion etching (RIE), neutral beam etching (NBE), or the like. Each first gate spacer 90 comprises a seal spacer portion 92 (of the seal layer 66), a first passivation spacer portion 94 (of the first passivation layer 72), an offset spacer first sub-portion 96 (of the first sub-layer 74), an offset spacer second sub-portion 98 (of the second sub-layer 76), a second passivation spacer portion 100 (of the second passivation layer 78), and a first dummy spacer portion 102 (of the first dummy layer 80). The anisotropic etch may further remove portions of the gate dielectric layer 52 and etch into the substrate 50, as illustrated in FIG. 6.

Figure 7:
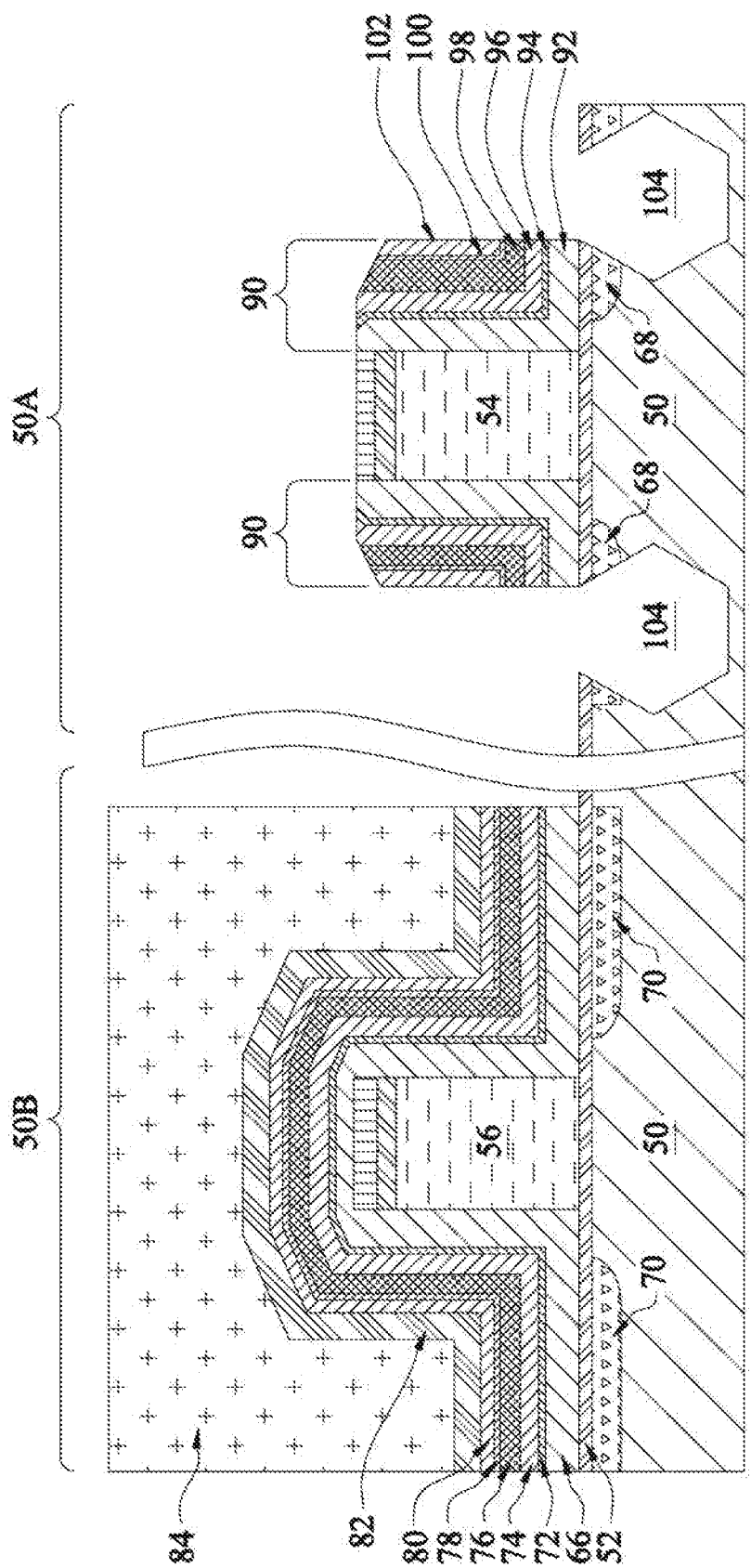

In FIG. 7, recesses 104 are formed in the substrate 50 on opposing sides of the first gate stack in the first region 50A. The recesses 104 are for subsequently formed epitaxial source/drain regions. The recesses 104 may be formed using, for example, a wet etch selective to the material of the substrate 50, which may further be isotropic or selective to a desired crystalline plane of the substrate 50. Additionally, n-type impurities, such as phosphorus, arsenic, or the like, may be implanted into surfaces of the recesses 104.

Figure 8:
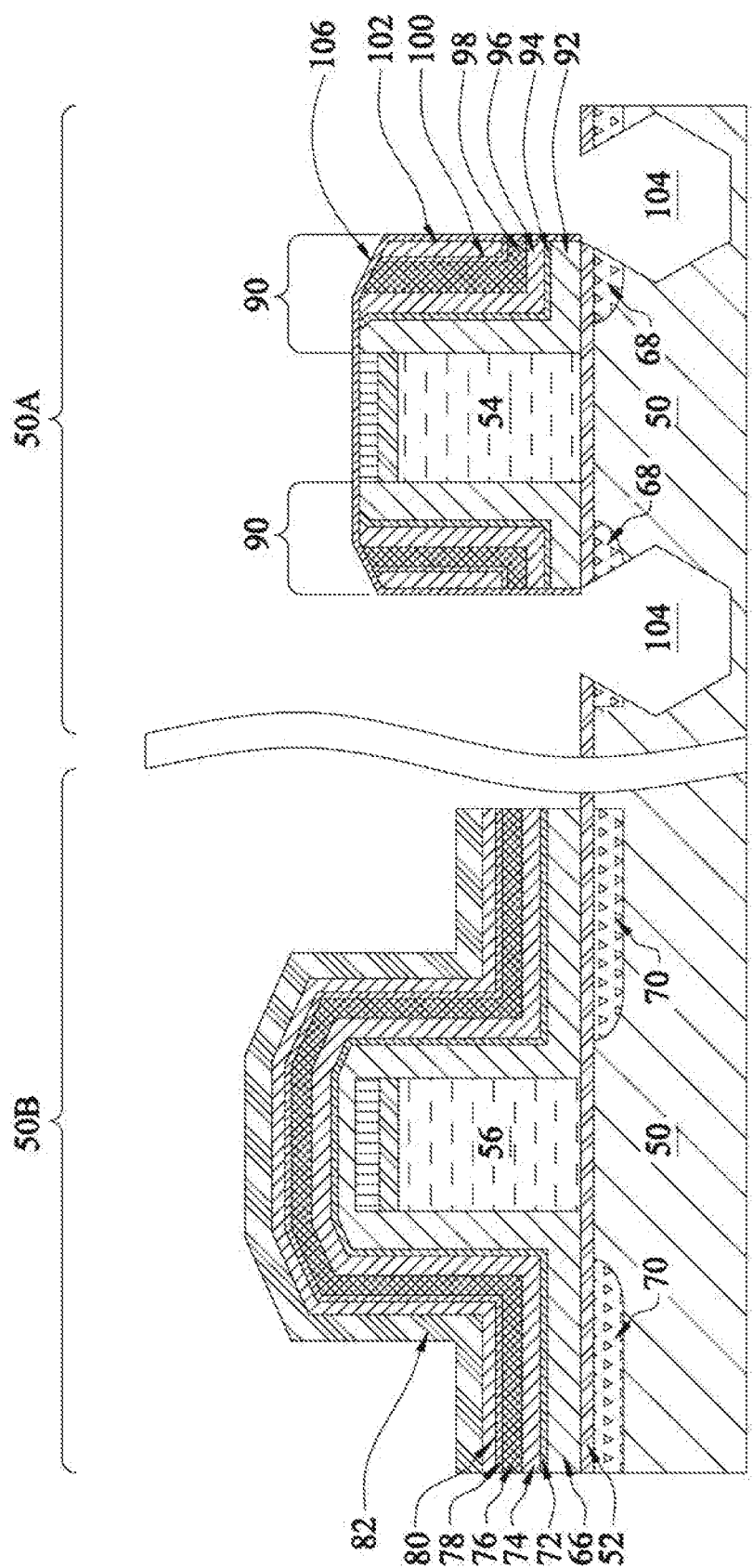

In FIG. 8, the mask 84 is removed from the second region 50B of the substrate 50. The removal may be by any acceptable process, such as a wet chemical removal, a plasma ashing, or the like. After the mask 84 is removed, the first gate spacers 90 are treated to form a third passivation layer 106 on exterior surfaces of the first gate spacers 90. The third passivation layer 106 may be formed by performing an appropriate treatment on the first gate spacers 90 to passivate dangling bonds of the first gate spacers 90. In some embodiments, the treatment may be a wet treatment, a plasma treatment, a thermal treatment, or a combination thereof, such as the treatments discussed above in forming the first passivation layer 72. The treatment can terminate dangling bonds of the first gate spacers 90 to form the third passivation layer 106. The third passivation layer 106 may be a monolayer, e.g., a layer with a thickness of substantially one atom and/or molecule. In some embodiments, the third passivation layer 106 can have a thickness between about 3 Å and about 20 Å, such as about 10 Å. A terminating species of the treatment can be —O, —OH, —F, —Cl, the like, or a combination thereof. The third passivation layer 106 may be an oxide, a fluoride, or the like of one or more of the respective portions of the first gate spacers 90.

Figure 9:
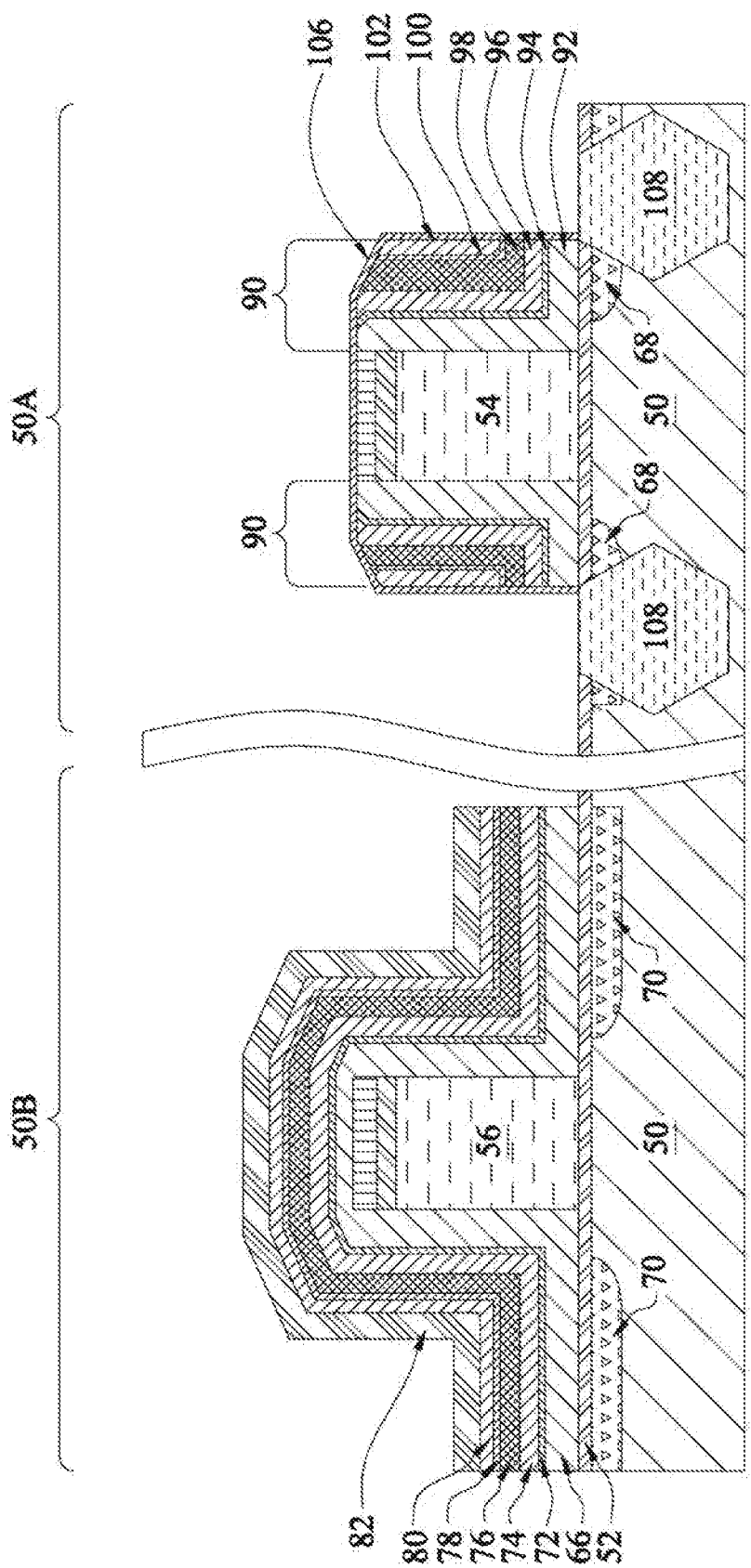

In FIG. 9, epitaxial source/drain regions 108 are formed in the recesses 104. In some embodiments, the epitaxial source/drain regions 108 are formed by epitaxially growing a material in the recesses 104, such as by metal-organic CVD (MOCVD), molecular beam epitaxy (MBE), liquid phase epitaxy (LPE), vapor phase epitaxy (VPE), selective epitaxial growth (SEG), the like, or a combination thereof. The epitaxial source/drain regions 108 may comprise silicon, SiC, SiCP, SiP, or the like.

Figure 10:
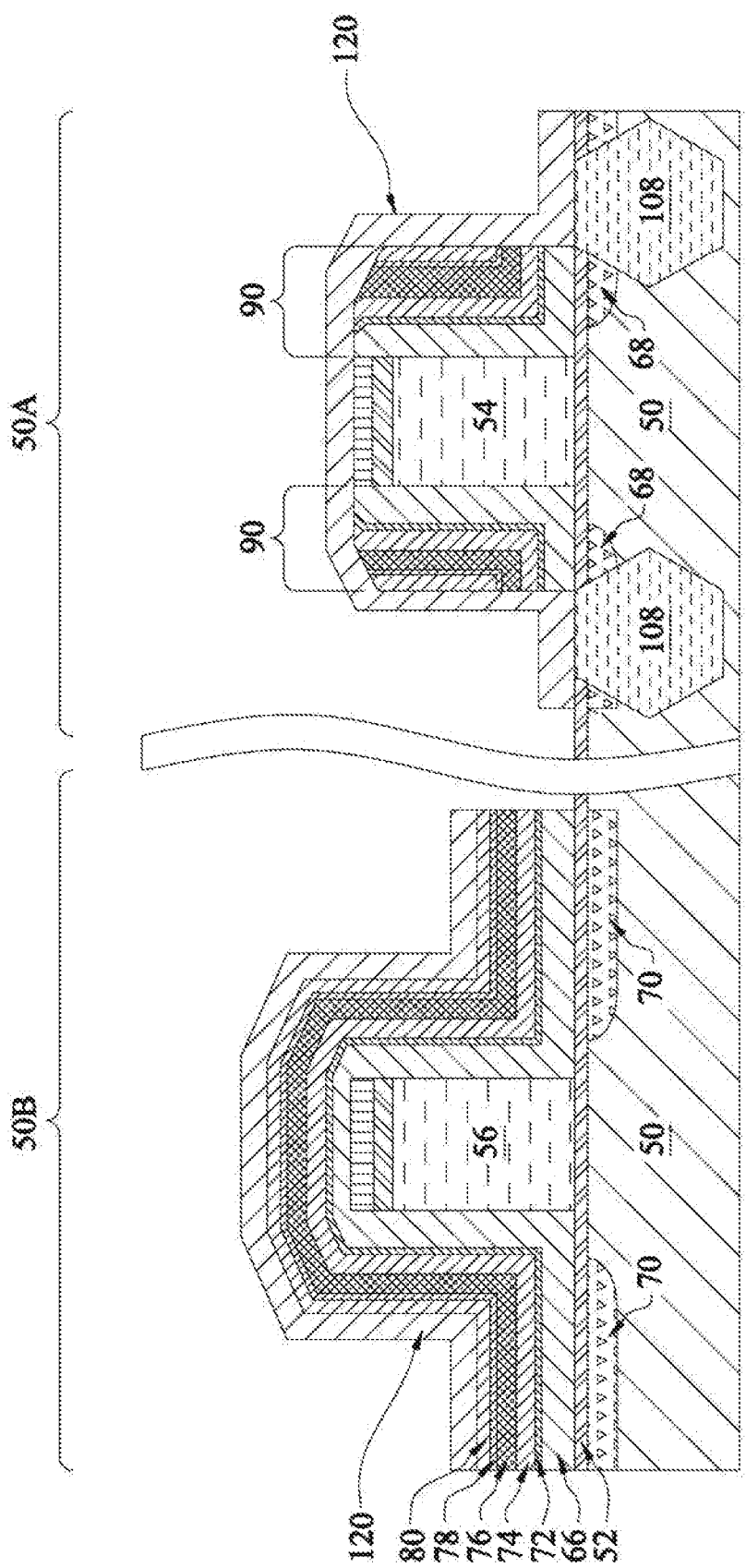

In FIG. 10, the BARC 82 in the second region 50B is removed. The BARC 82 is removed using, for example, an etch that is selective to the BARC 82, which may be isotropic and/or a wet etch. Once the BARC 82 is removed, an acceptable cleaning process, such as a SC2, SC1, and a dilute hydrofluoric (HF) acid dip, may be performed. The cleaning may remove the third passivation layer 106 from the first gate spacers 90. FIG. 10 illustrates the third passivation layer 106 being removed from the first gate spacers 90. In other embodiments, the third passivation layer 106 may remain. After any cleaning, a second dummy layer 120 is formed on the substrate 50, first gate spacers 90, and first gate stack in the first region 50A and on the first dummy layer 80 in the second region 50B. The second dummy layer 120 can be silicon nitride (SiN), silicon carbonnitride (SiCN), or the like, and can be deposited by ALD, CVD, PEALD, or the like. The second dummy layer 120 is formed conformally on the substrate 50, first gate spacers 90, and first gate stack in the first region 50A and on the first dummy layer 80 in the second region 50B. The second dummy layer 120 can have a substantially uniform thickness in a direction orthogonal to a corresponding underlying surface, which may be between about 1 nm and about 10 nm, such as about 5 nm. It should be noted that in the processing to remove the BARC 82 and/or the cleaning, the first dummy layer 80 and the first dummy spacer portions 102 of the first gate spacers 90 may experience some loss. In FIG. 10, a thickness of the first dummy layer 80 and the first dummy spacer portions 102 may be between about 1 nm and about 10 nm, such as about 5 nm.

Figure 11:
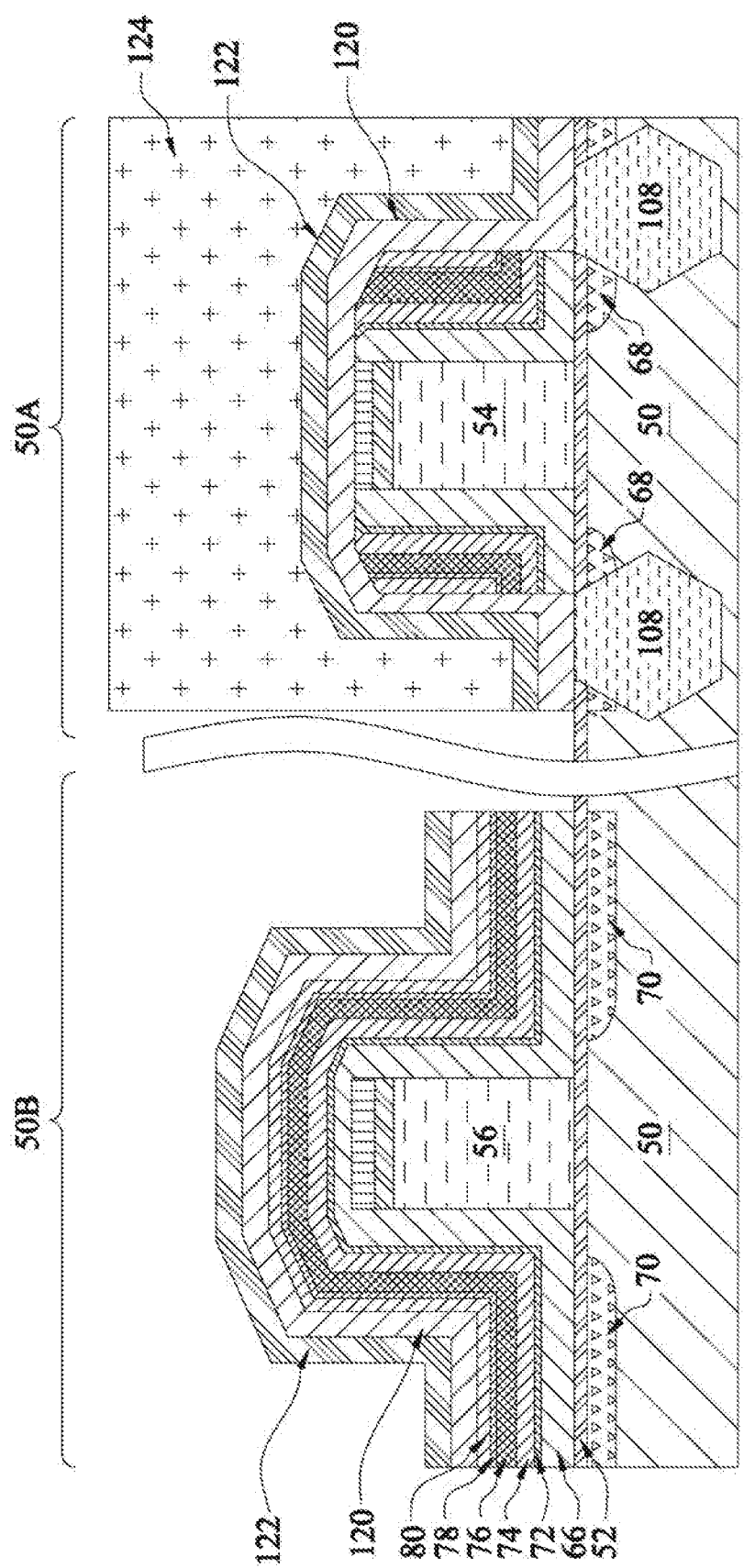

In FIG. 11, a BARC 122 is formed on the second dummy layer 120. The BARC 122 can be a silicon oxide, silicon oxynitride, or the like, and can be deposited by ALD, CVD, or the like. FIG. 11 further illustrates a mask 124 formed on the BARC 122 in the first region 50A, e.g., NMOS region, of the substrate 50. The mask may be a photoresist formed, for example, by spin coating and patterned by a photolithography technique.

Figure 12:
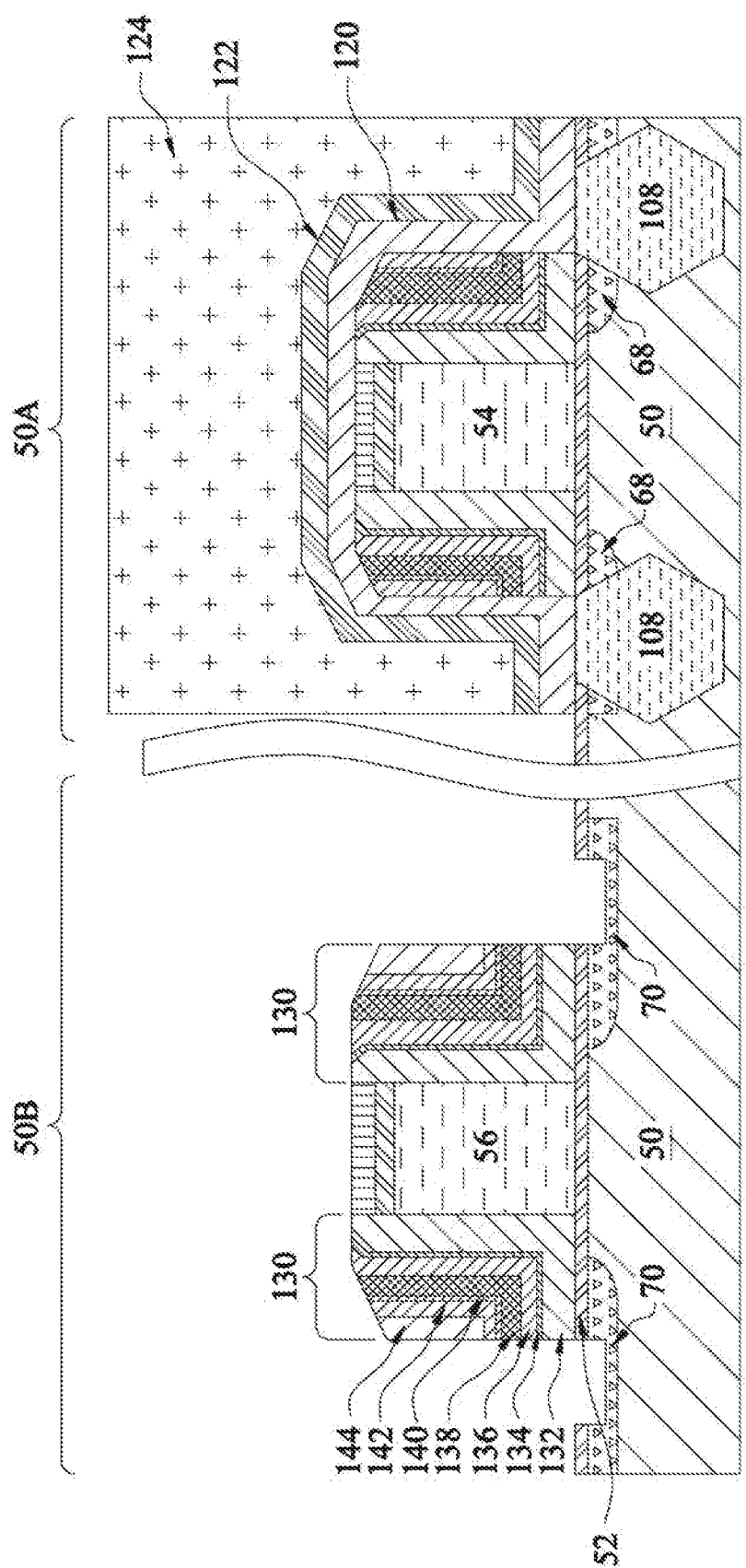

In FIG. 12, the BARC 122 in the second region 50B is removed, and the seal layer 66, first passivation layer 72, first sub-layer 74, second sub-layer 76, second passivation layer 78, first dummy layer 80, and second dummy layer 120 in the second region 50B are etched. The mask 124 in the first region 50A functions to prevent the layers in the first region 50A from being removed or etched during these steps. The BARC 122 is removed from the second region 50B using, for example, an etch that is selective to the BARC 122, which may be isotropic and/or a wet etch. Once the BARC 122 is removed from the second region 50B, an anisotropic etch is performed to etch the seal layer 66, first passivation layer 72, first sub-layer 74, second sub-layer 76, second passivation layer 78, first dummy layer 80, and second dummy layer 120 in the second region 50B. Second gate spacers 130 are formed along sidewalls of the second gate stack in the second region 50B as a result of the anisotropic etch. The anisotropic etch can be any acceptable etch process, such as RIE, NBE, or the like. Each second gate spacer 130 comprises a seal spacer portion 132 (of the seal layer 66), a first passivation spacer portion 134 (of the first passivation layer 72), an offset spacer first sub-portion 136 (of the first sub-layer 74), an offset spacer second sub-portion 138 (of the second sub-layer 76), a second passivation spacer portion 140 (of the second passivation layer 78), a first dummy spacer portion 142 (of the first dummy layer 80), and a second dummy spacer portion 144 (of the second dummy layer 120). The anisotropic etch may further remove portions of the gate dielectric layer 52 and etch into the substrate 50, as illustrated in FIG. 12.

Figure 13:
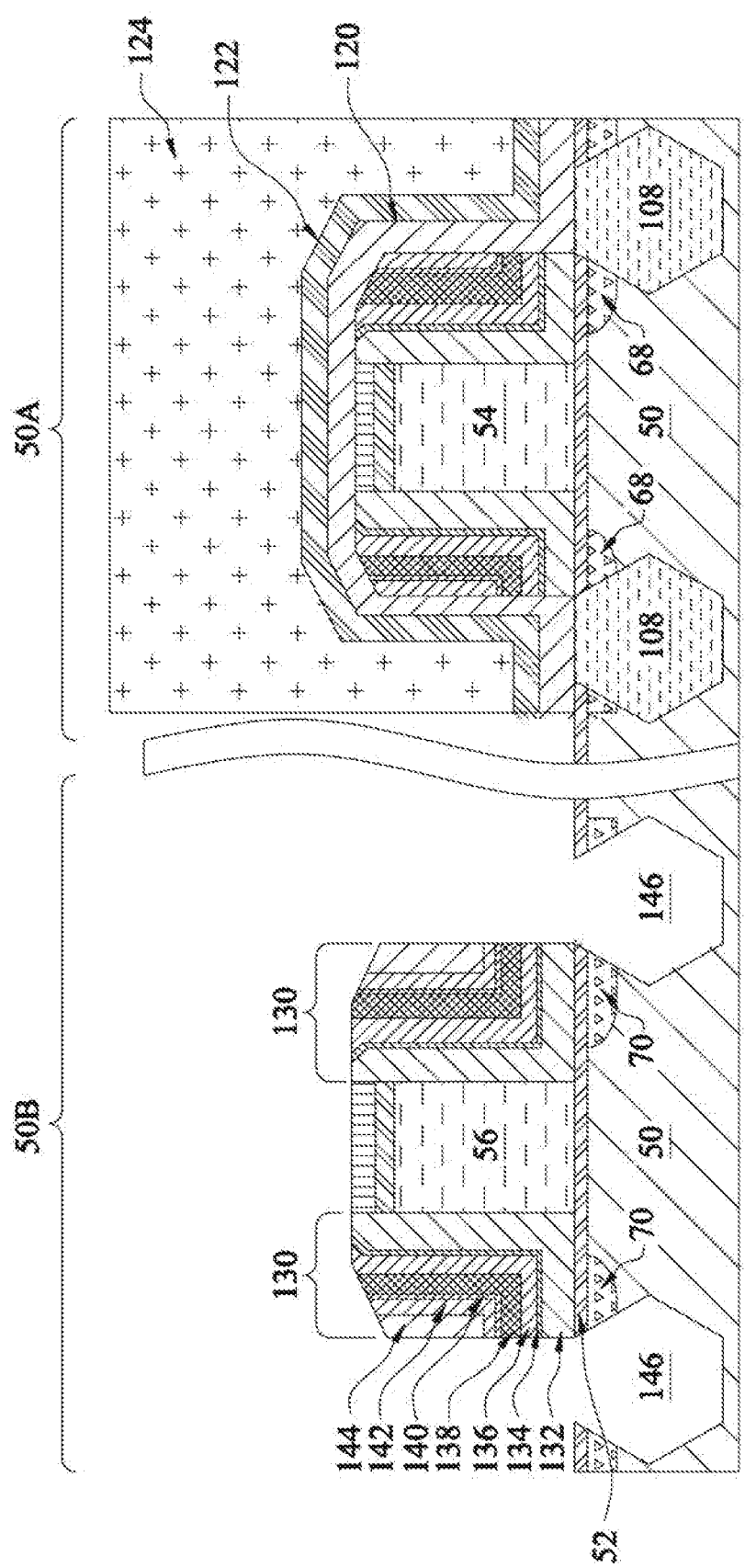

In FIG. 13, recesses 146 are formed in the substrate 50 on opposing sides of the second gate stack in the second region 50B. The recesses 146 are for subsequently formed epitaxial source/drain regions. The recesses 146 may be formed using, for example, a wet etch selective to the material of the substrate 50, which may further be isotropic or selective to a desired crystalline plane of the substrate 50. Additionally, p-type impurities, such as boron, $BF_2$, or the like, may be implanted into surfaces of the recesses 146.

Figure 14:
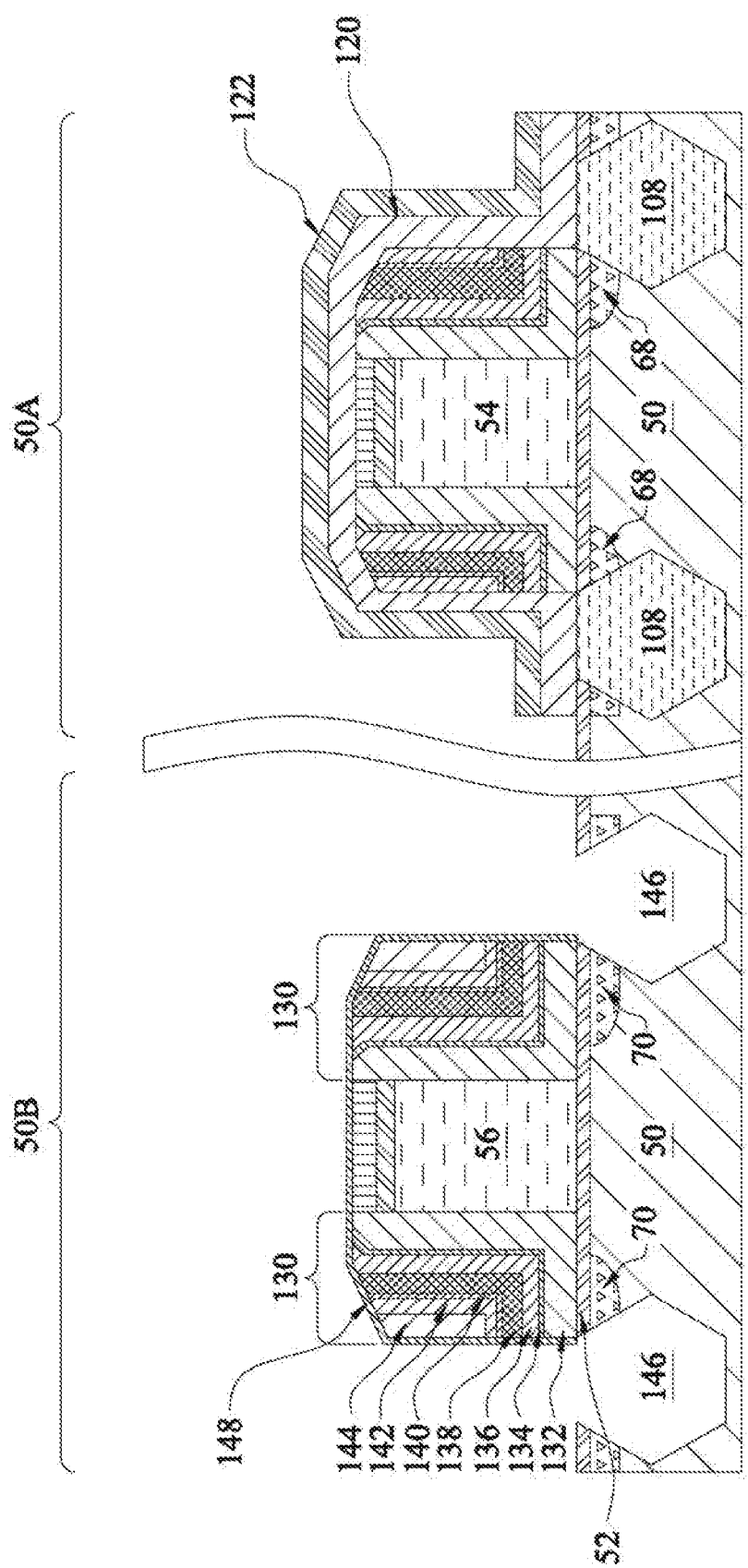

In FIG. 14, the mask 124 is removed from the first region 50A of the substrate 50. The removal may be by any acceptable process, such as a wet chemical removal, a plasma ashing, or the like. After the mask 124 is removed, the second gate spacers 130 are treated to form a fourth passivation layer 148 on exterior surfaces of the second gate spacers 130. The fourth passivation layer 148 may be formed by performing an appropriate treatment on the second gate spacers 130 to passivate dangling bonds of the second gate spacers 130. In some embodiments, the treatment may be a wet treatment, a plasma treatment, a thermal treatment, or a combination thereof, such as the treatments discussed above in forming the first passivation layer 72. The treatment can terminate dangling bonds of the second gate spacers 130 to form the fourth passivation layer 148. The fourth passivation layer 148 may be a monolayer, e.g., a layer with a thickness of substantially one atom and/or molecule. In some embodiments, the fourth passivation layer 148 can have a thickness between about 3 Å and about 20 Å, such as about 10 Å. A terminating species of the treatment can be —O, —OH, —F, —Cl, the like, or a combination thereof. The fourth passivation layer 148 may be an oxide, a fluoride, or the like of one or more of the respective portions of the second gate spacers 130.

Figure 15:
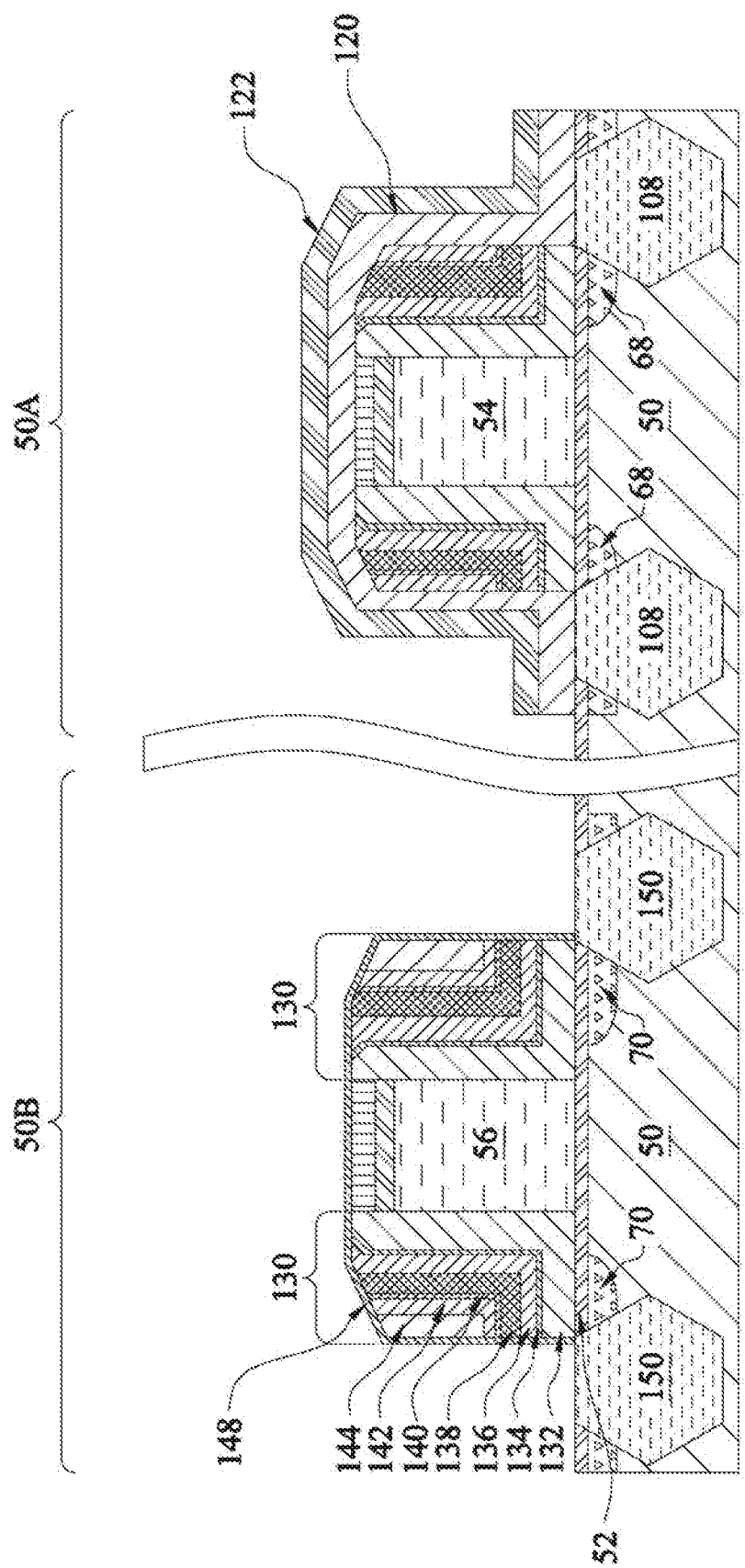

In FIG. 15, epitaxial source/drain regions 150 are formed in the recesses 146. In some embodiments, the epitaxial source/drain regions 150 are formed by epitaxially growing a material in the recesses 146, such as by MOCVD, MBE, LPE, VPE, SEG, the like, or a combination thereof. The epitaxial source/drain regions 150 may comprise SiGe, SiGeB, Ge, GeSn, or the like.

Figure 16:
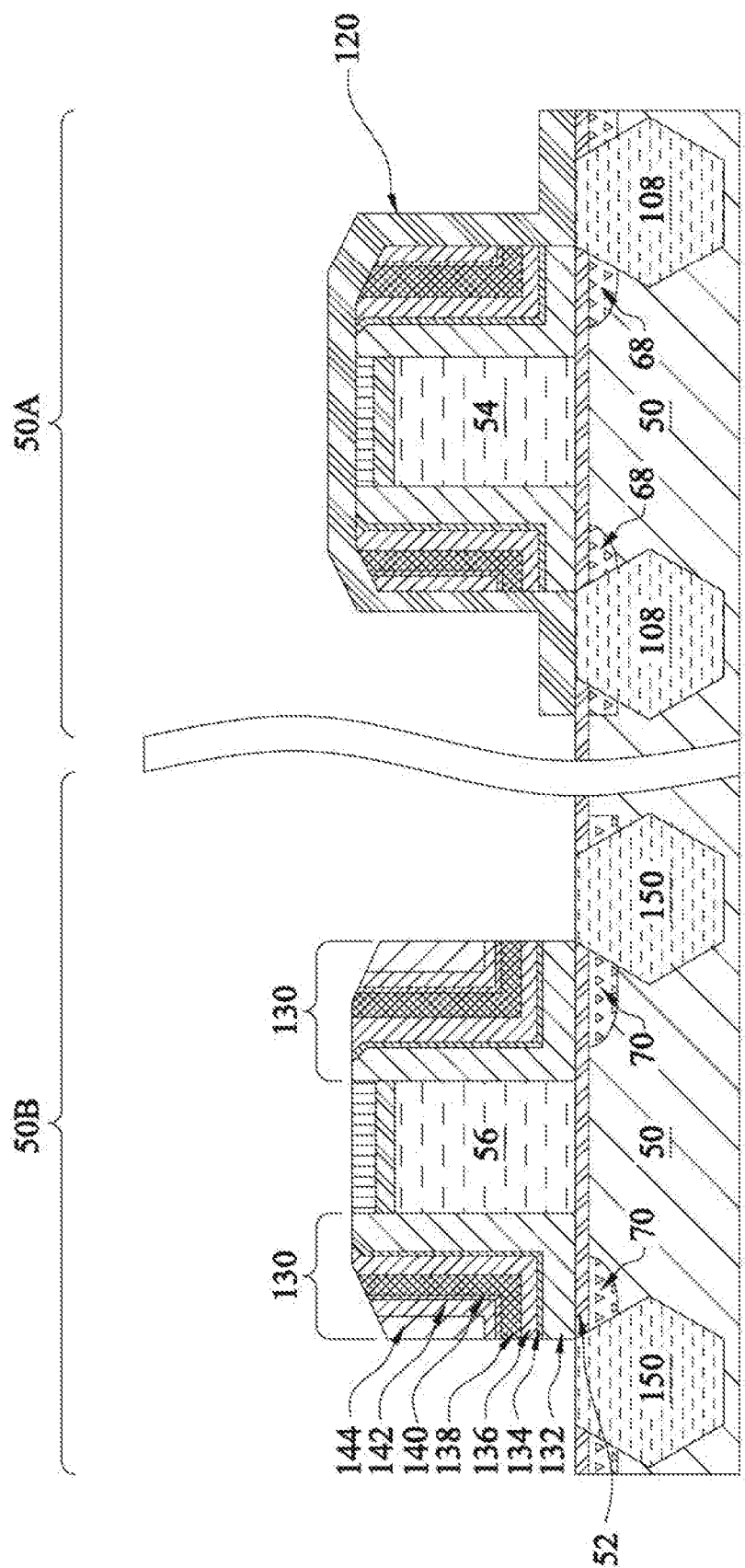

In FIG. 16, the BARC 122 in the first region 50A is removed. The BARC 122 is removed using, for example, an etch that is selective to the BARC 122, which may be isotropic and/or a wet etch. Once the BARC 122 is removed, an acceptable cleaning process, such as a SC2, SC1, and a dilute hydrofluoric (HF) acid dip, may be performed. The cleaning may remove the fourth passivation layer 148 from the second gate spacers 130. FIG. 16 illustrates the fourth passivation layer 148 being removed from the second gate spacers 130. In other embodiments, the fourth passivation layer 148 may remain.

Figure 17:
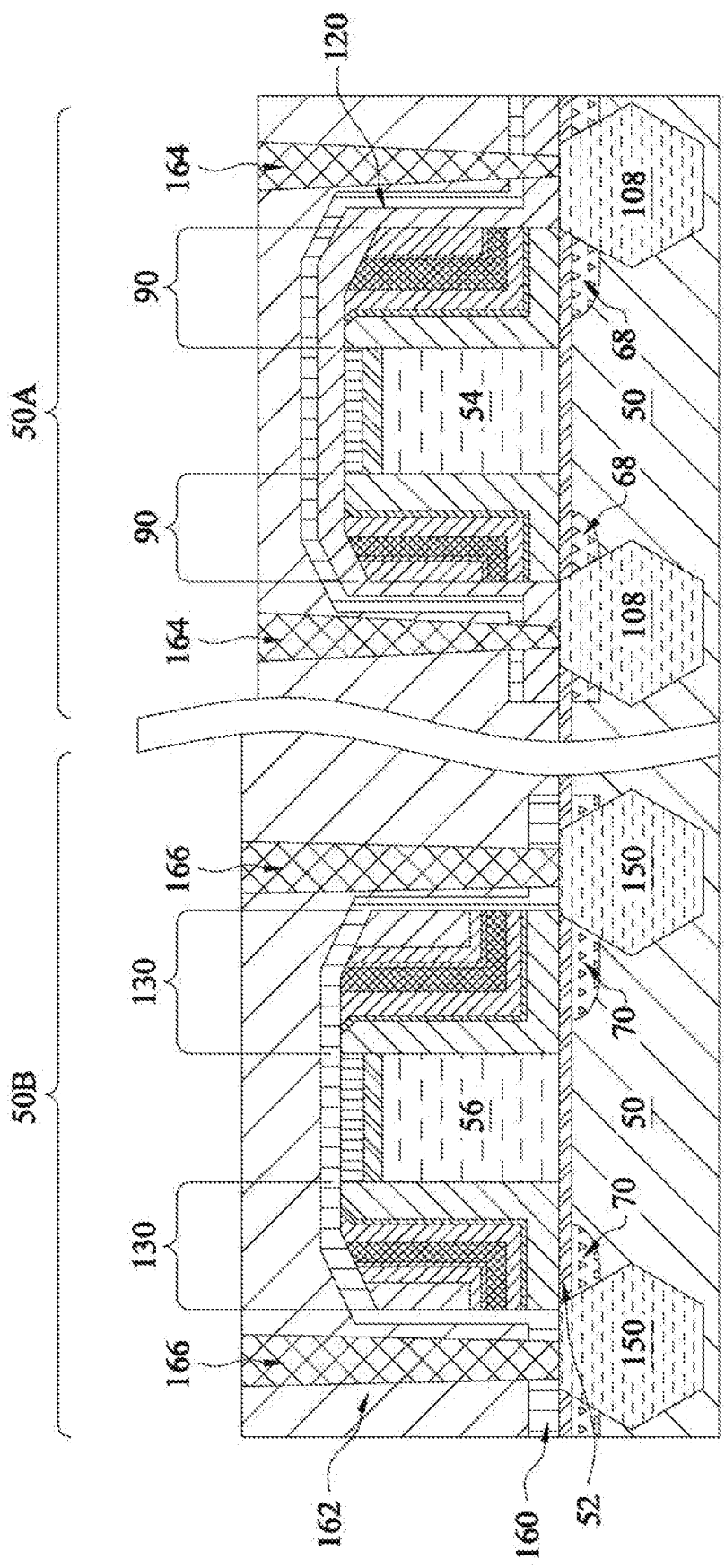

FIG. 17 illustrates structures after even further processing. An etch stop layer 160 is conformally formed over the substrate 50. The etch stop layer 160 is over the epitaxial source/drain regions 150, along the second gate spacers 130, and over the second gate stack in the second region 50B and is over the second dummy layer 120 in the first region 50A. The etch stop layer 160 may be silicon nitride, SiON, silicon carbonnitride (SiCN), a combination thereof, of the like, and may be deposited by CVD, ALD, or the like. An Inter-Layer Dielectric (ILD) 162 is deposited over the etch stop layer 160. The ILD 162 may be formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, PECVD, flowable CVD (FCVD), or the like. The ILD 162 may be planarized, such as by a chemical mechanical polish (CMP).

Contacts 164 and 166 are formed through ILD 162, etch stop layer 160, and/or second dummy layer 120 to the epitaxial source/drain regions 108 and 150, respectively. Openings for contacts 164 and 166 are formed through the ILD 162, etch stop layer 160, and/or second dummy layer 120. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 162. The remaining liner and conductive material form contacts 164 and 166 in the openings. An anneal process may be performed to form a silicide at the interface between the epitaxial source/drain regions 108 and 150 and the contacts 164 and 166, respectively. Contacts 164 are physically and electrically coupled to the epitaxial source/drain regions 108, and contacts 166 are physically and electrically coupled to the epitaxial source/drain regions 150.

Although not explicitly shown, a person having ordinary skill in the art will readily understand that further processing steps may be performed on the structure in FIG. 17. For example, various Inter-Metal Dielectrics (IMD) and their corresponding metallizations may be formed over ILD 162.

FIGS. 18 through 30 illustrate cross sectional views of intermediate stages of a method to manufacture devices in accordance with some embodiments. Processing begins as discussed above with respect to FIGS. 1 through 3.

Figure 18:
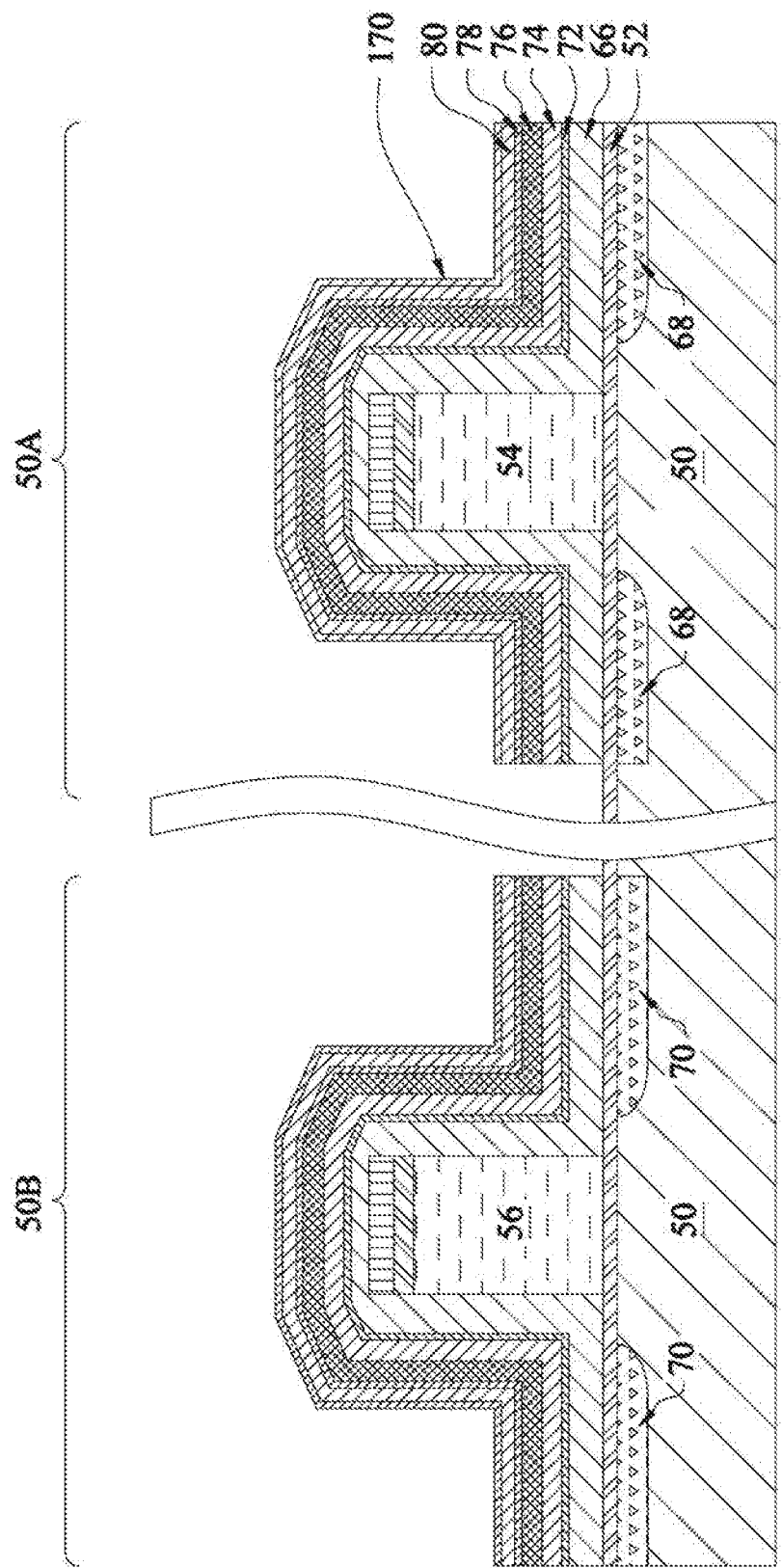
FIGS. 18 through 30 illustrate cross sectional views of intermediate stages of a second method to manufacture devices in accordance with some embodiments.

In FIG. 18, a first dummy layer 80 is formed on the second passivation layer 78. The first dummy layer 80 can be silicon nitride (SiN), silicon carbonnitride (SiCN), or the like, and can be deposited by ALD, CVD, PEALD, or the like. The first dummy layer 80 is formed conformally on the second passivation layer 78. The first dummy layer 80 can have a substantially uniform thickness in a direction orthogonal to a corresponding underlying surface, which may be between about 1 nm and about 10 nm, such as about 5 nm. A third passivation layer 170 is formed on the first dummy layer 80. The third passivation layer 170 is formed on exterior surfaces of the first dummy layer 80. The third passivation layer 170 may be formed by performing an appropriate treatment on the first dummy layer 80 to passivate dangling bonds of the first dummy layer 80. In some embodiments, the treatment may be a wet treatment, a plasma treatment, a thermal treatment, or a combination thereof, such as the treatments discussed above in forming the first passivation layer 72. The treatment can terminate dangling bonds of the first dummy layer 80 to form the third passivation layer 170. The third passivation layer 170 may be a monolayer, e.g., a layer with a thickness of substantially one atom and/or molecule. In some embodiments, the third passivation layer 170 can have a thickness between about 3 Å and about 20 Å, such as about 10 Å. A terminating species of the treatment can be —O, —OH, —F, —Cl, the like, or a combination thereof. The third passivation layer 170 may be an oxide, a fluoride, or the like of the first dummy layer 80.

Figure 19:
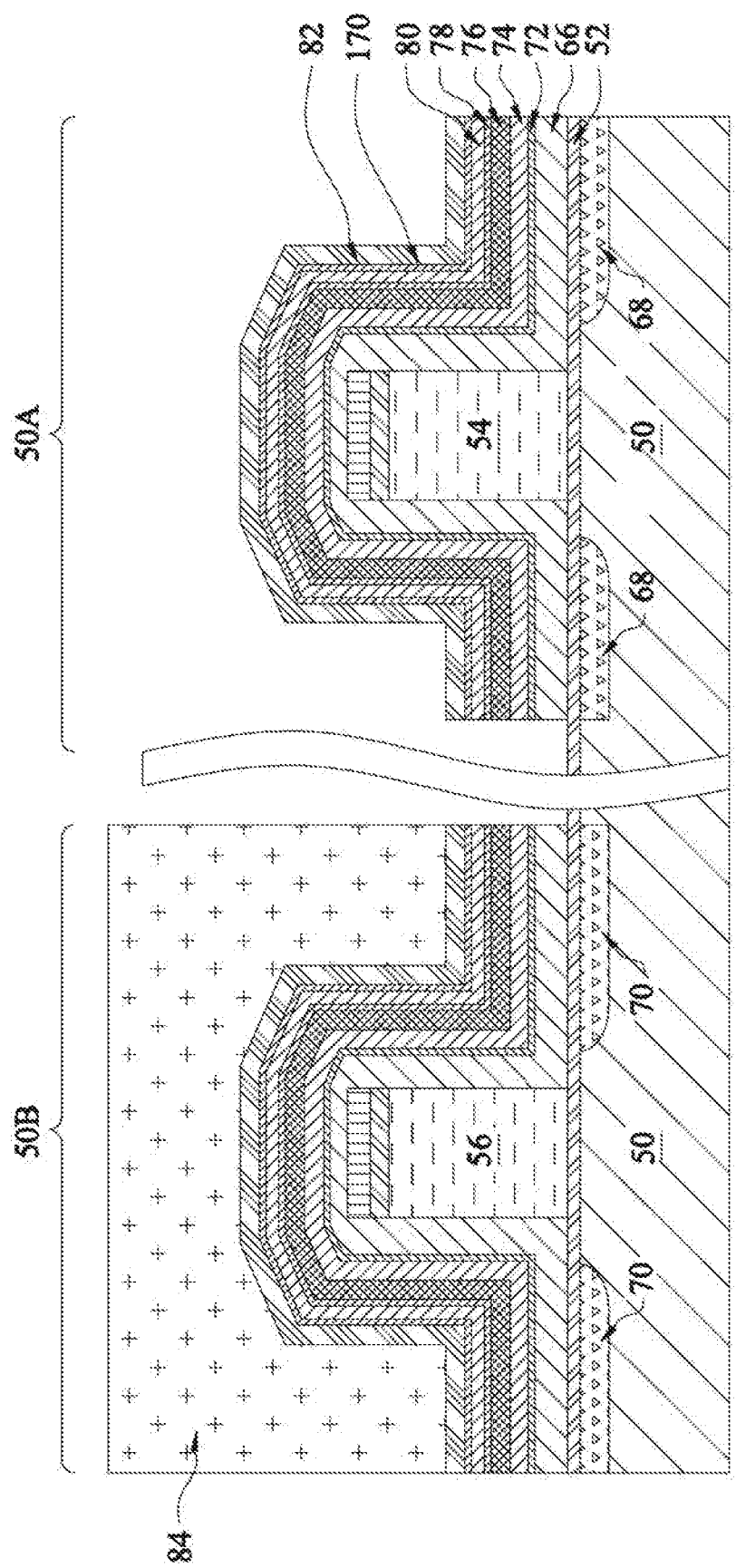

In FIG. 19, a BARC 82 is formed on the third passivation layer 170. The BARC 82 can be a silicon oxide, silicon oxynitride, or the like, and can be deposited by ALD, CVD, or the like. FIG. 5 further illustrates a mask 84 formed on the BARC 82 in the second region 50B, e.g., PMOS region, of the substrate 50. The mask may be a photoresist formed, for example, by spin coating and patterned by a photolithography technique.

Figure 20:
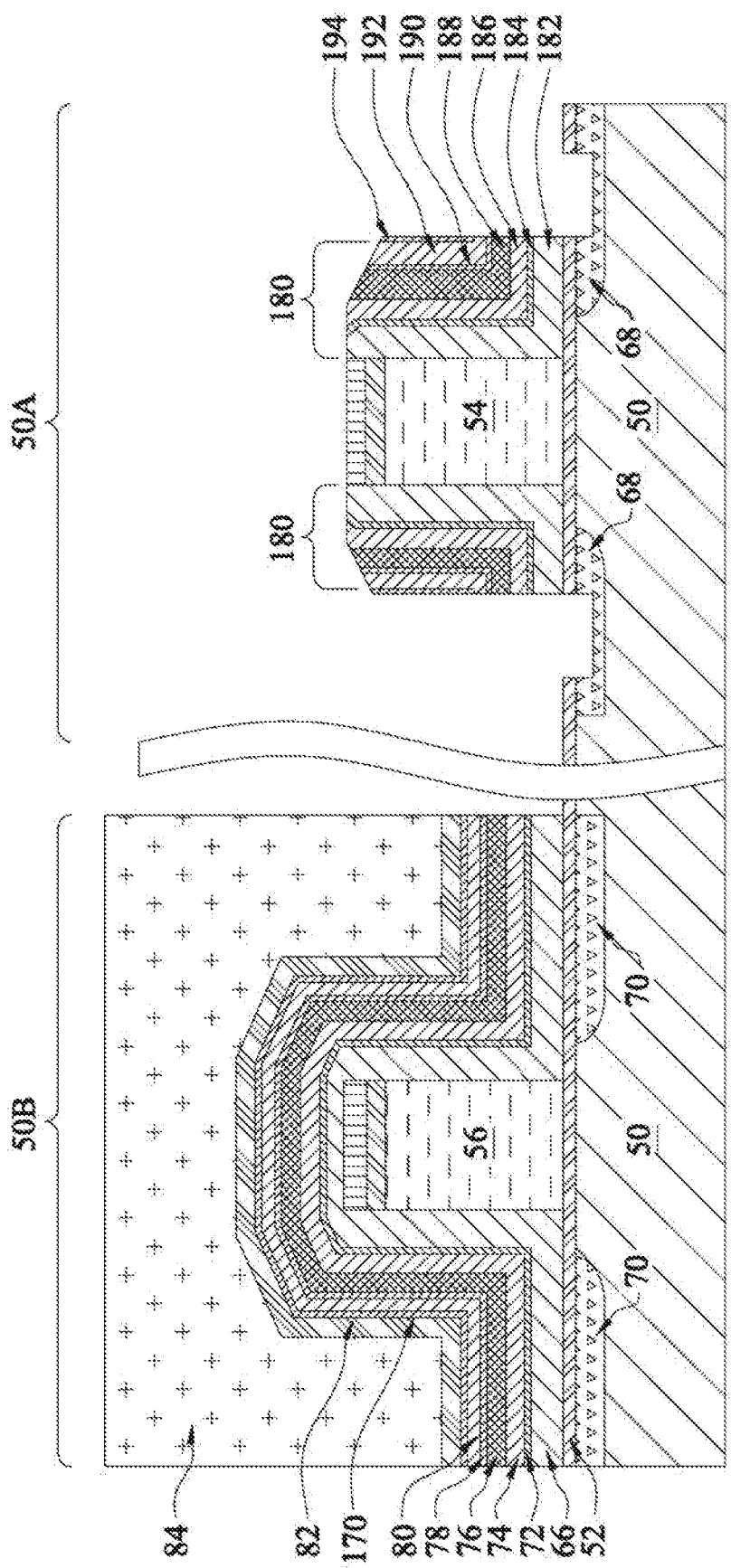

In FIG. 20, the BARC 82 in the first region 50A is removed, and the seal layer 66, first passivation layer 72, first sub-layer 74, second sub-layer 76, second passivation layer 78, first dummy layer 80, and third passivation layer 170 in the first region 50A are etched. The mask 84 in the second region 50B functions to prevent the layers in the second region 50B from being removed or etched during these steps. The BARC 82 is removed from the first region 50A using, for example, an etch that is selective to the BARC 82, which may be isotropic and/or a wet etch. Once the BARC 82 is removed from the first region 50A, an anisotropic etch is performed to etch the seal layer 66, first passivation layer 72, first sub-layer 74, second sub-layer 76, second passivation layer 78, first dummy layer 80, and third passivation layer 170 in the first region 50A. First gate spacers 180 are formed along sidewalls of the first gate stack in the first region 50A as a result of the anisotropic etch. The anisotropic etch can be any acceptable etch process, such as RIE, NBE, or the like. Each first gate spacer 180 comprises a seal spacer portion 182 (of the seal layer 66), a first passivation spacer portion 184 (of the first passivation layer 72), an offset spacer first sub-portion 186 (of the first sub-layer 74), an offset spacer second sub-portion 188 (of the second sub-layer 76), a second passivation spacer portion 190 (of the second passivation layer 78), a first dummy spacer portion 192 (of the first dummy layer 80), and a third passivation spacer portion 194 (of the third passivation layer 170). The anisotropic etch may further remove portions of the gate dielectric layer 52 and etch into the substrate 50, as illustrated in FIG. 20.

Figure 21:
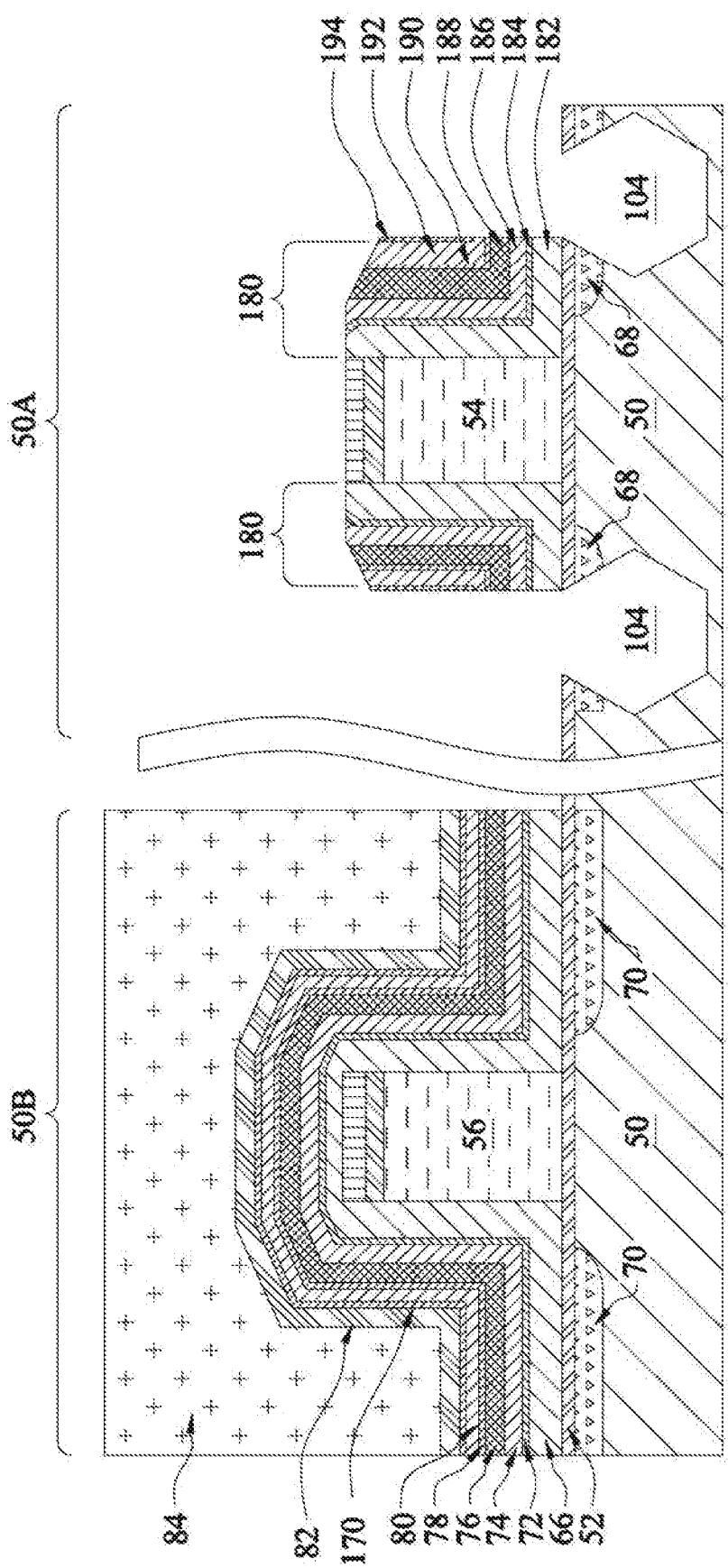

In FIG. 21, recesses 104 are formed in the substrate 50 on opposing sides of the first gate stack in the first region 50A. The recesses 104 are for subsequently formed epitaxial source/drain regions. The recesses 104 may be formed using, for example, a wet etch selective to the material of the substrate 50, which may further be isotropic or selective to a desired crystalline plane of the substrate 50. Additionally, n-type impurities, such as phosphorus, arsenic, or the like, may be implanted into surfaces of the recesses 104.

Figure 22:
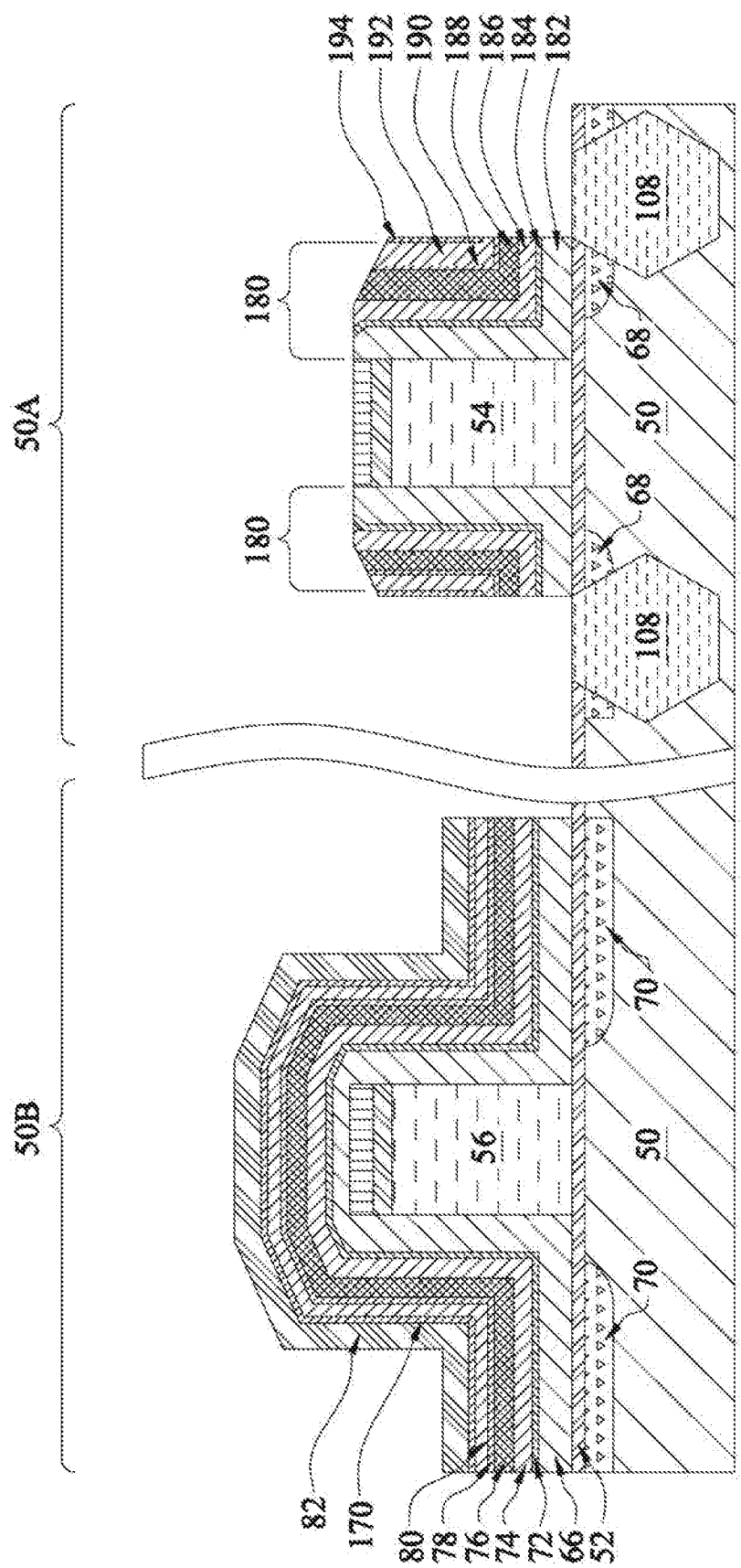

In FIG. 22, the mask 84 is removed from the second region 50B of the substrate 50. The removal may be by any acceptable process, such as a wet chemical removal, a plasma ashing, or the like. Then, epitaxial source/drain regions 108 are formed in the recesses 104. In some embodiments, the epitaxial source/drain regions 108 are formed by epitaxially growing a material in the recesses 104, such as by MOCVD, MBE, LPE, VPE, SEG, the like, or a combination thereof. The epitaxial source/drain regions 108 may comprise silicon, SiC, SiCP, SiP, or the like.

Figure 23:
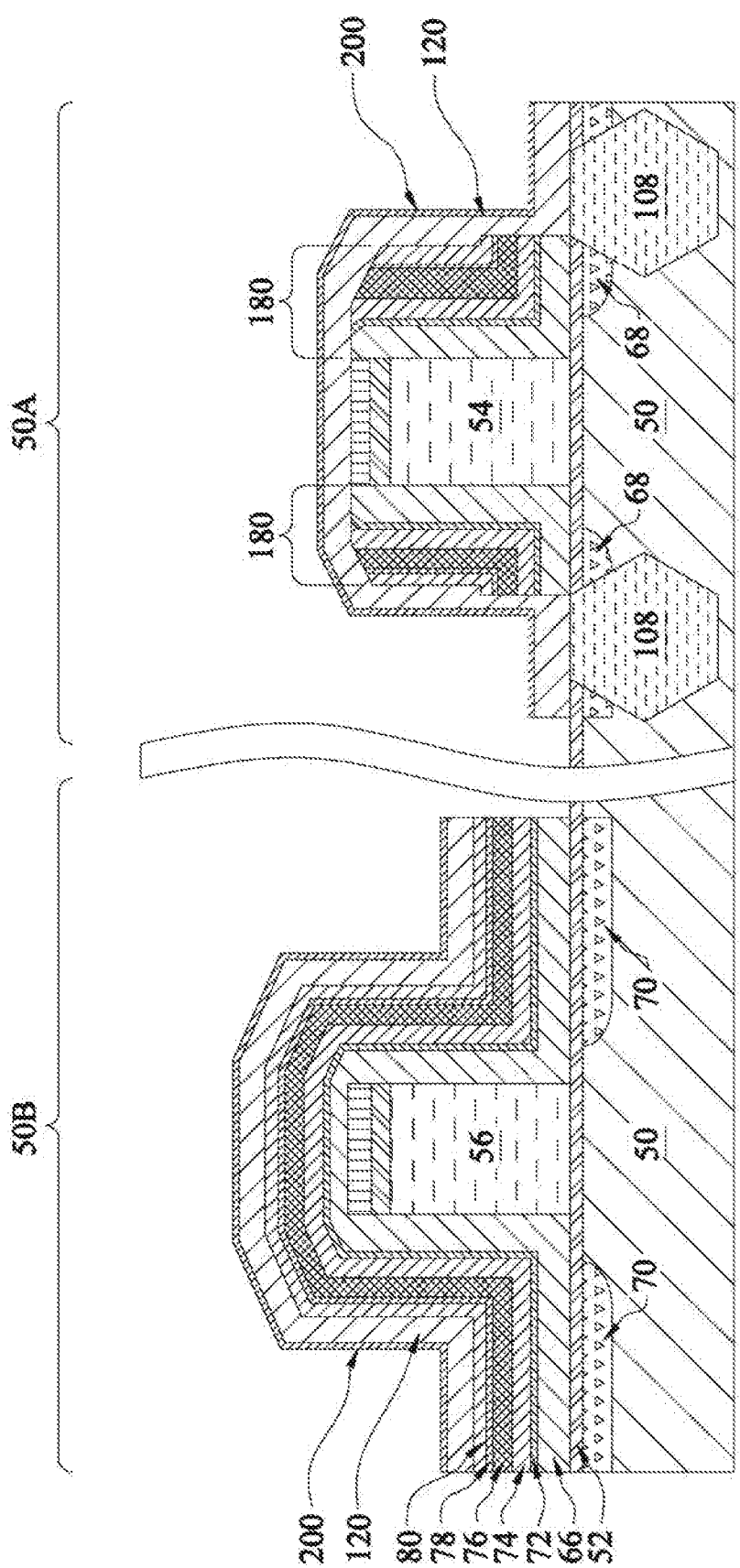

In FIG. 23, the BARC 82 in the second region 50B is removed. The BARC 82 is removed using, for example, an etch that is selective to the BARC 82, which may be isotropic and/or a wet etch. Once the BARC 82 is removed, an acceptable cleaning process, such as a SC2, SC1, and a dilute hydrofluoric (HF) acid dip, may be performed. The cleaning may remove third passivation spacer portion 194 from the first gate spacers 180 in the first region 50A and remove the third passivation layer 170 from the first dummy layer 80 in the second region 50B. FIG. 23 illustrates the third passivation spacer portion 194 being removed from the first gate spacers 180 in the first region 50A and the third passivation layer 170 being removed from the first dummy layer 80 in the second region 50B. In other embodiments, the third passivation spacer portion 194 in the first region 50A and the third passivation layer 170 in the second region 50B may remain. After any cleaning, a second dummy layer 120 is formed on the substrate 50, first gate spacers 180, and first gate stack in the first region 50A and on the first dummy layer 80 in the second region 50B. The second dummy layer 120 can be silicon nitride (SiN), silicon carbonnitride (SiCN), or the like, and can be deposited by ALD, CVD, or the like. The second dummy layer 120 is formed conformally on the substrate 50, first gate spacers 180, and first gate stack in the first region 50A and on the first dummy layer 80 in the second region 50B. The second dummy layer 120 can have a substantially uniform thickness in a direction orthogonal to a corresponding underlying surface, which may be between about 1 nm and about 10 nm, such as about 5 nm. It should be noted that in the processing to remove the BARC 82 and/or the cleaning, the first dummy layer 80 and the first dummy spacer portions 192 of the first gate spacers 180 may experience some loss. In FIG. 22, a thickness of the first dummy layer 80 and the first dummy spacer portions 192 may be between about 1 nm and about 10 nm, such as about 5 nm.

A fourth passivation layer 200 is formed on the second dummy layer 120. The fourth passivation layer 200 is formed on exterior surfaces of the second dummy layer 120. The fourth passivation layer 200 may be formed by performing an appropriate treatment on the second dummy layer 120 to passivate dangling bonds of the second dummy layer 120. In some embodiments, the treatment may be a wet treatment, a plasma treatment, a thermal treatment, or a combination thereof, such as the treatments discussed above in forming the first passivation layer 72. The treatment can terminate dangling bonds of the second dummy layer 120 to form the fourth passivation layer 200. The fourth passivation layer 200 may be a monolayer, e.g., a layer with a thickness of substantially one atom and/or molecule. In some embodiments, the fourth passivation layer 200 can have a thickness between about 3 Å and about 20 Å, such as about 10 Å. A terminating species of the treatment can be —O, —OH, —F, —Cl, the like, or a combination thereof. The fourth passivation layer 200 may be an oxide, a fluoride, or the like of the second dummy layer 120.

Figure 24:
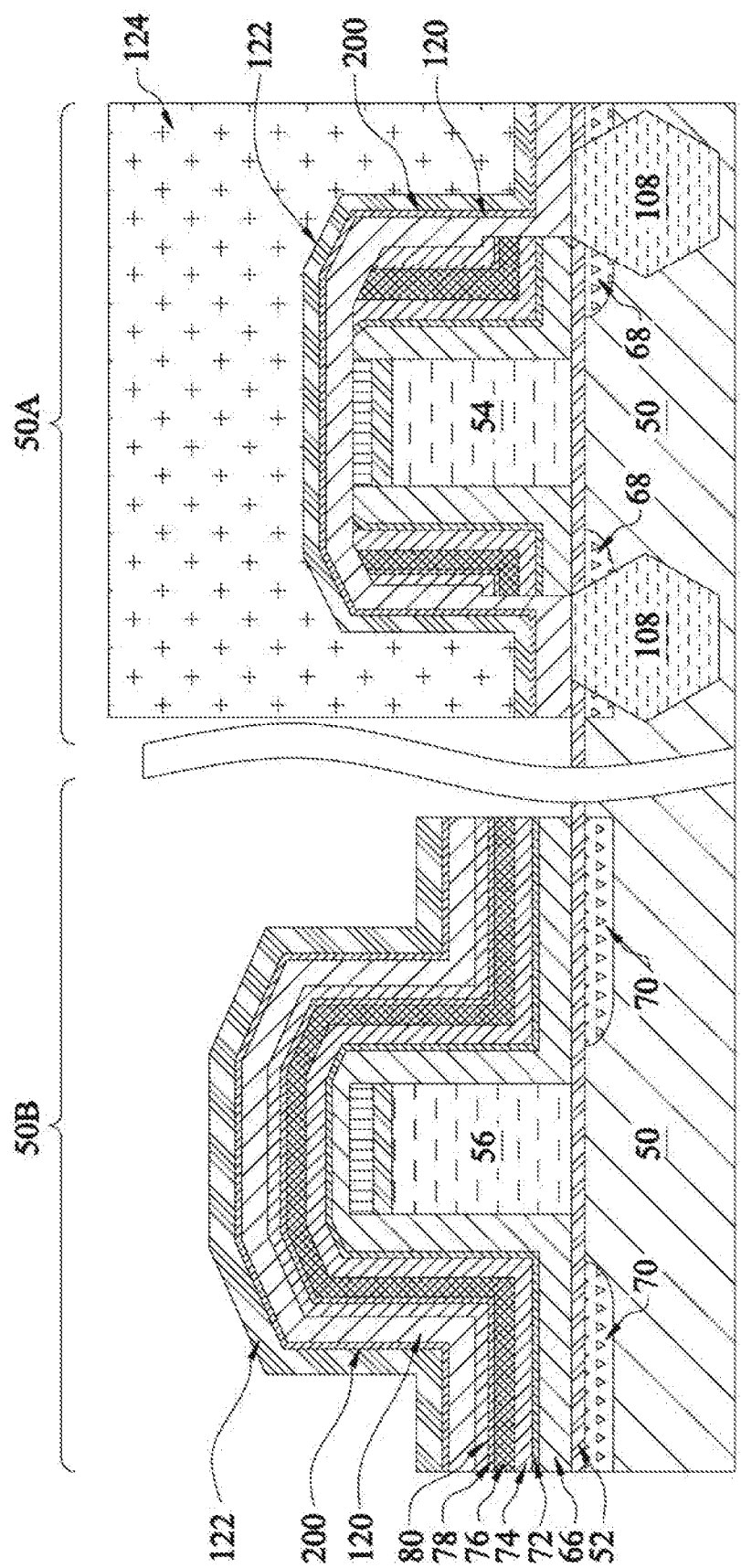

In FIG. 24, a BARC 122 is formed on the fourth passivation layer 200. The BARC 122 can be a silicon oxide, silicon oxynitride, or the like, and can be deposited by ALD, CVD, or the like. FIG. 24 further illustrates a mask 124 formed on the BARC 122 in the first region 50A, e.g., NMOS region, of the substrate 50. The mask may be a photoresist formed, for example, by spin coating and patterned by a photolithography technique.

Figure 25:
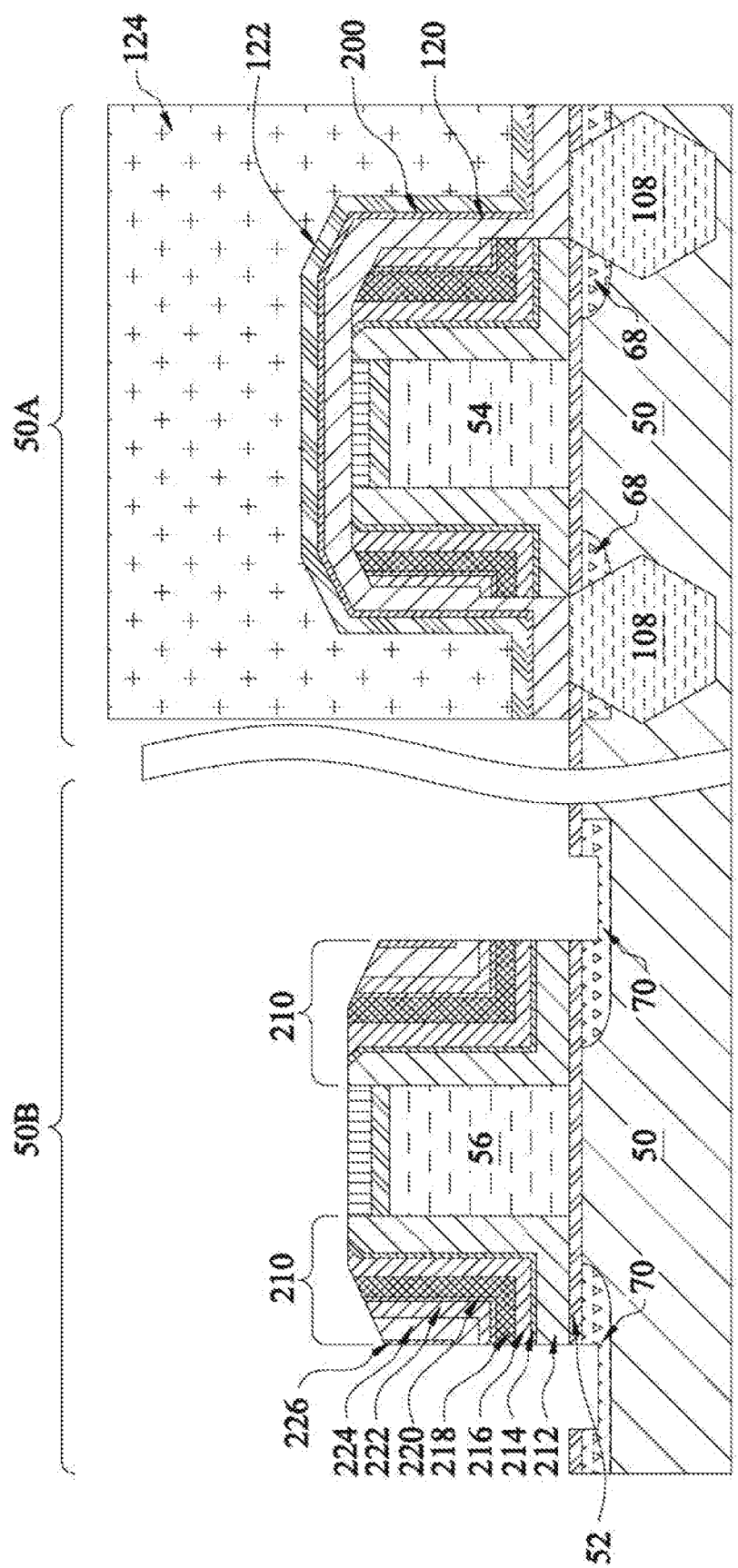

In FIG. 25, the BARC 122 in the second region 50B is removed, and the seal layer 66, first passivation layer 72, first sub-layer 74, second sub-layer 76, second passivation layer 78, first dummy layer 80, second dummy layer 120, and fourth passivation layer 200 in the second region 50B are etched. The mask 124 in the first region 50A functions to prevent the layers in the first region 50A from being removed or etched during these steps. The BARC 122 is removed from the second region 50B using, for example, an etch that is selective to the BARC 122, which may be isotropic and/or a wet etch. Once the BARC 122 is removed from the second region 50B, an anisotropic etch is performed to etch the seal layer 66, first passivation layer 72, first sub-layer 74, second sub-layer 76, second passivation layer 78, first dummy layer 80, second dummy layer 120, and fourth passivation layer 200 in the second region 50B. Second gate spacers 210 are formed along sidewalls of the second gate stack in the second region 50B as a result of the anisotropic etch. The anisotropic etch can be any acceptable etch process, such as RIE, NBE, or the like. Each second gate spacer 210 comprises a seal spacer portion 212 (of the seal layer 66), a first passivation spacer portion 214 (of the first passivation layer 72), an offset spacer first sub-portion 216 (of the first sub-layer 74), an offset spacer second sub-portion 218 (of the second sub-layer 76), a second passivation spacer portion 220 (of the second passivation layer 78), a first dummy spacer portion 222 (of the first dummy layer 80), a second dummy spacer portion 224 (of the second dummy layer 120), and a third passivation spacer portion 226 (of the fourth passivation layer 200). The anisotropic etch may further remove portions of the gate dielectric layer 52 and etch into the substrate 50, as illustrated in FIG. 25.

Figure 26:
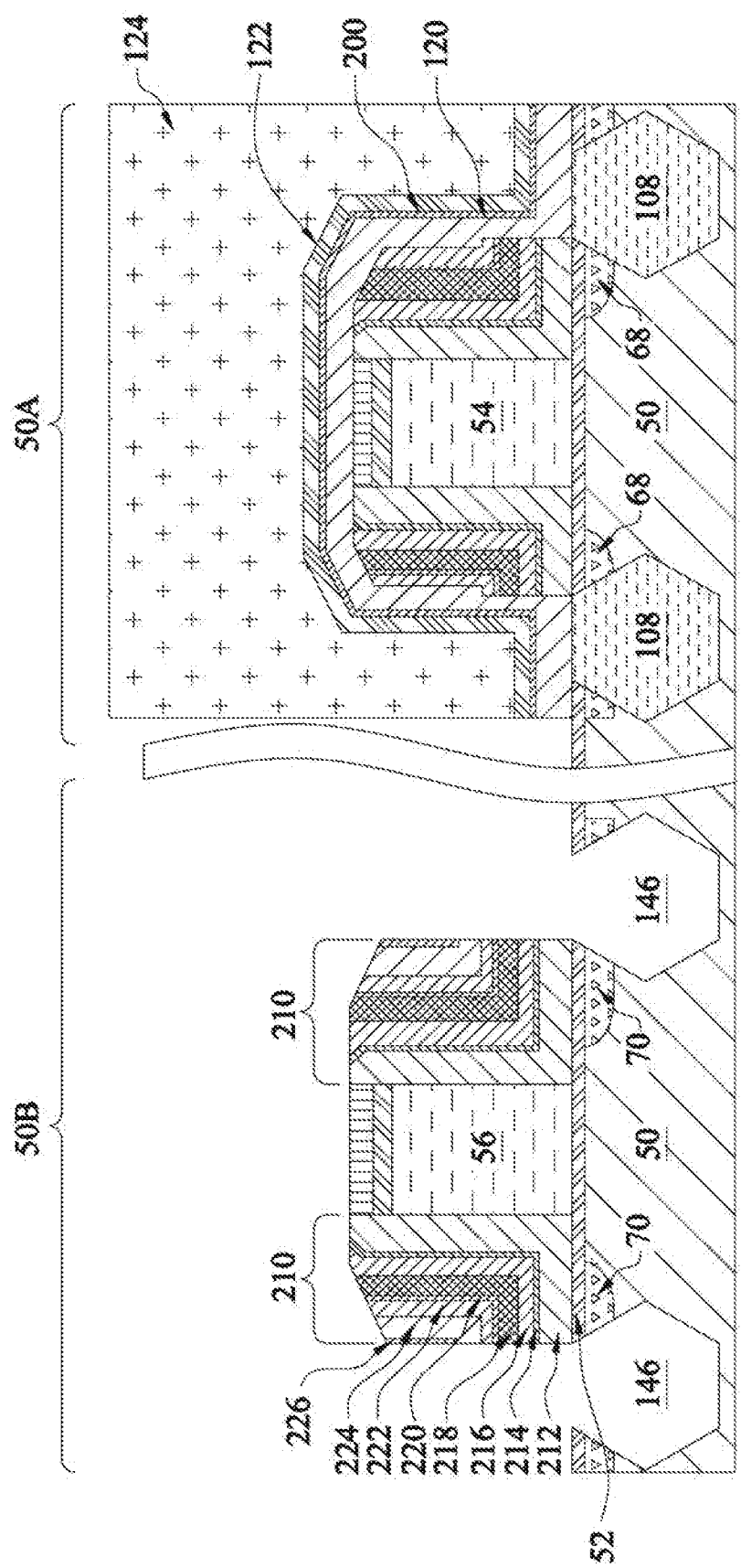

In FIG. 26, recesses 146 are formed in the substrate 50 on opposing sides of the second gate stack in the second region 50B. The recesses 146 are for subsequently formed epitaxial source/drain regions. The recesses 146 may be formed using, for example, a wet etch selective to the material of the substrate 50, which may further be isotropic or selective to a desired crystalline plane of the substrate 50. Additionally, p-type impurities, such as boron, $BF_2$, or the like, may be implanted into surfaces of the recesses 146.

Figure 27:
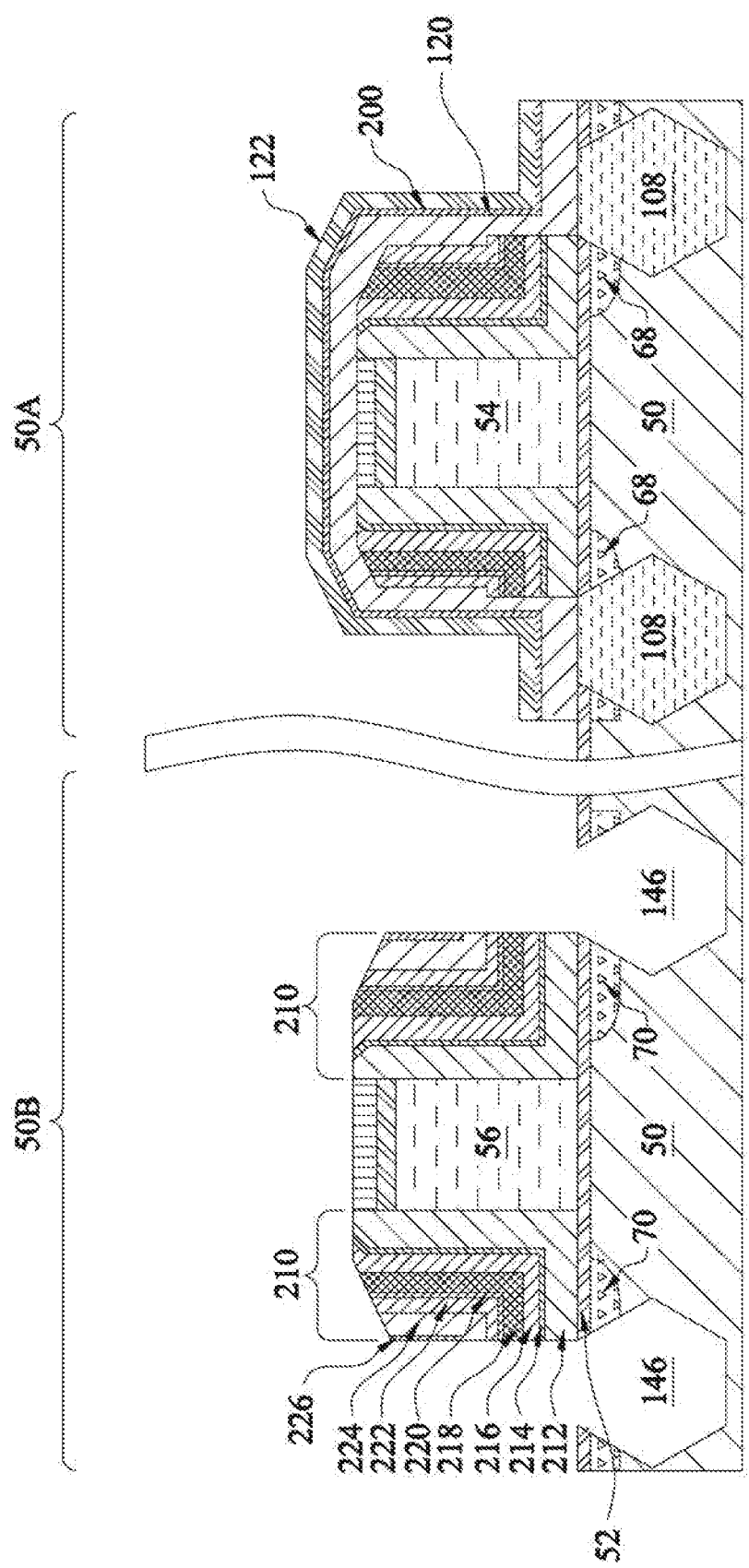

In FIG. 27, the mask 124 is removed from the first region 50A of the substrate 50. The removal may be by any acceptable process, such as a wet chemical removal, a plasma ashing, or the like.

Figure 28:
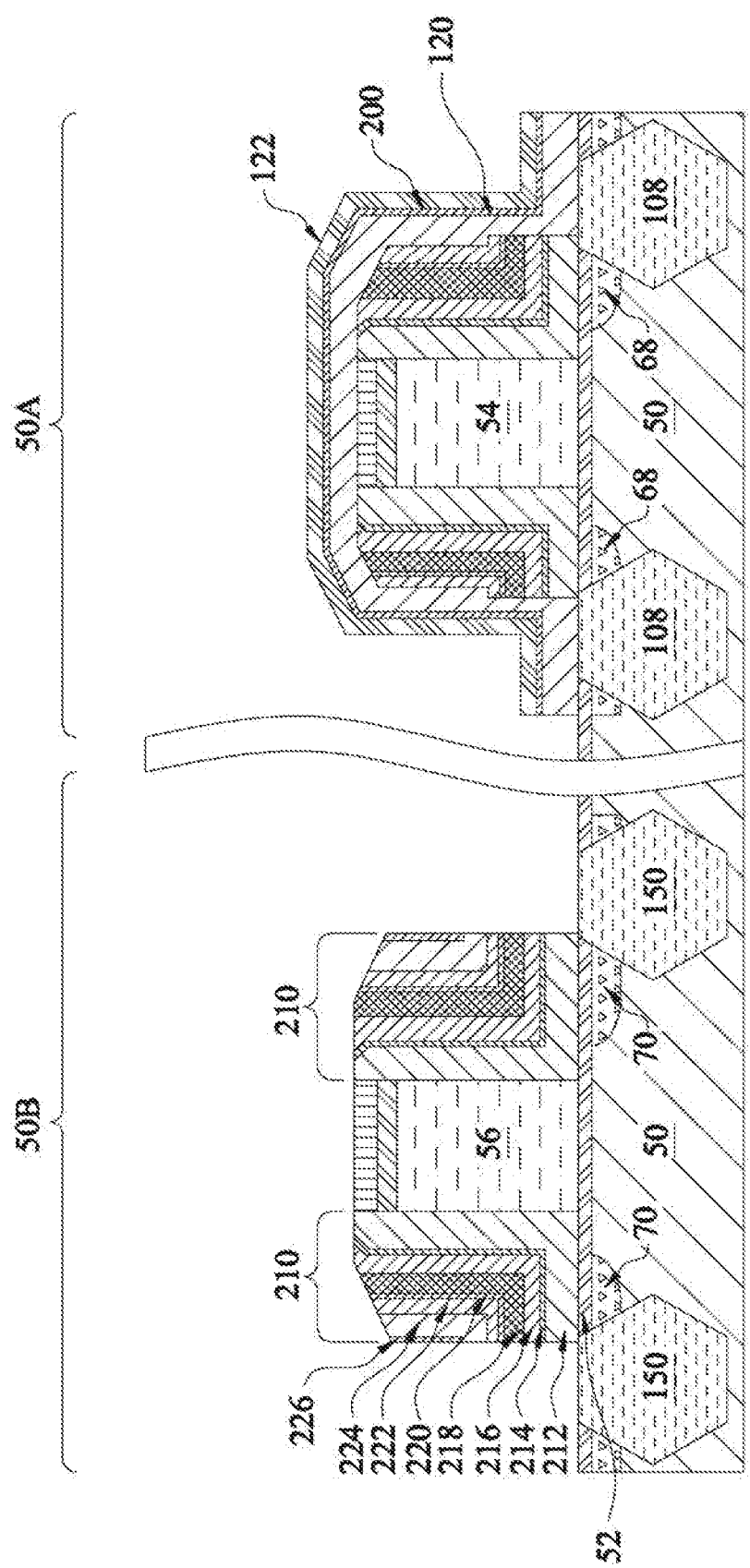

In FIG. 28, epitaxial source/drain regions 150 are formed in the recesses 146. In some embodiments, the epitaxial source/drain regions 150 are formed by epitaxially growing a material in the recesses 146, such as by MOCVD, MBE, LPE, VPE, SEG, the like, or a combination thereof. The epitaxial source/drain regions 150 may comprise SiGe, SiGeB, Ge, GeSn, or the like.

Figure 29:
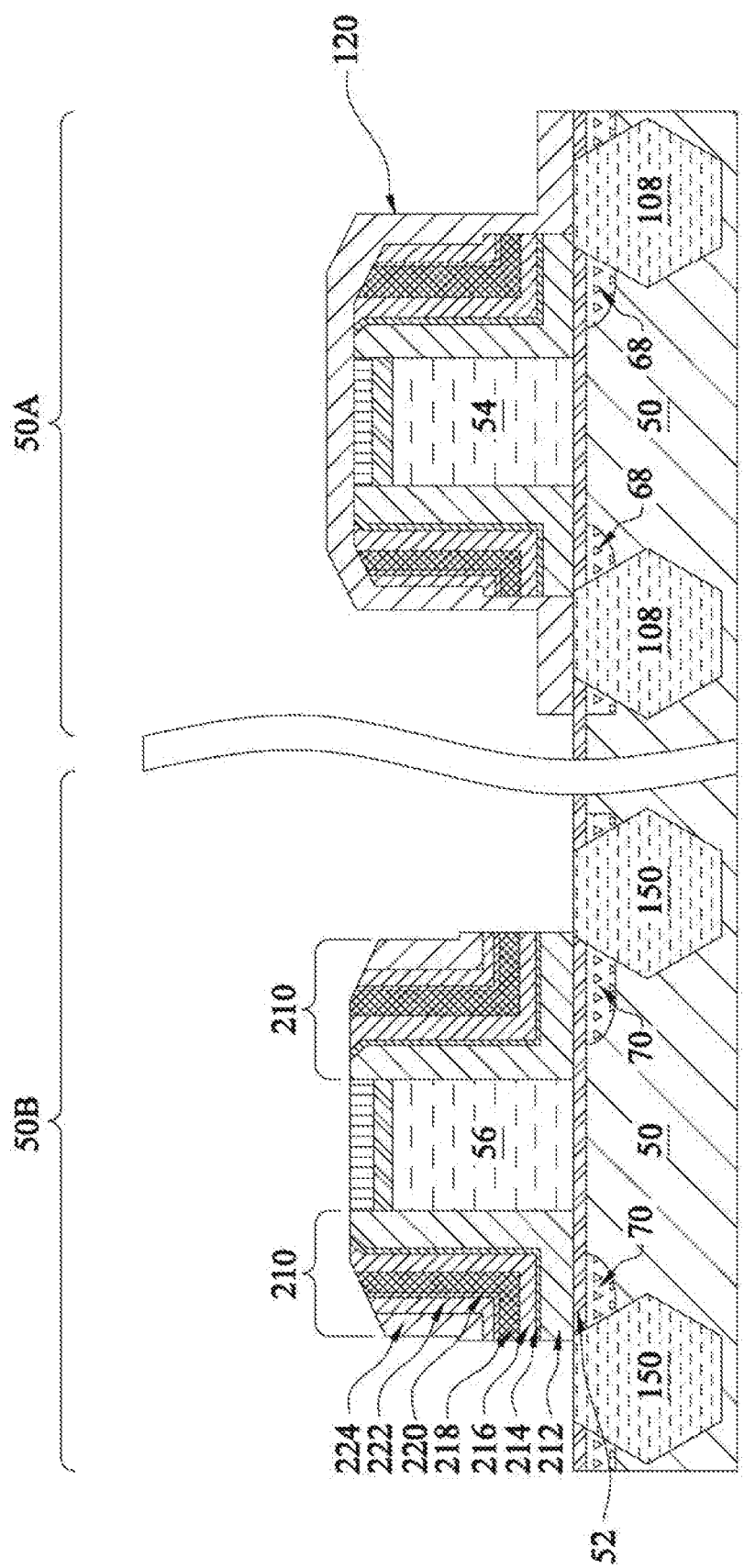

In FIG. 29, the BARC 122 in the first region 50A is removed. The BARC 122 is removed using, for example, an etch that is selective to the BARC 122, which may be isotropic and/or a wet etch. Once the BARC 122 is removed, an acceptable cleaning process, such as a SC2, SC1, and a dilute hydrofluoric (HF) acid dip, may be performed. The cleaning may remove the third passivation spacer portion 226 from the second gate spacers 210 in the second region 50B and remove the fourth passivation layer 200 from the second dummy layer 120 in the first region 50A. FIG. 29 illustrates the third passivation spacer portion 226 being removed from the second gate spacers 210 in the second region 50B and the fourth passivation layer 200 being removed from the second dummy layer 120 in the first region 50A. In other embodiments, third passivation spacer portion 226 and the fourth passivation layer 200 may remain.

Figure 30:
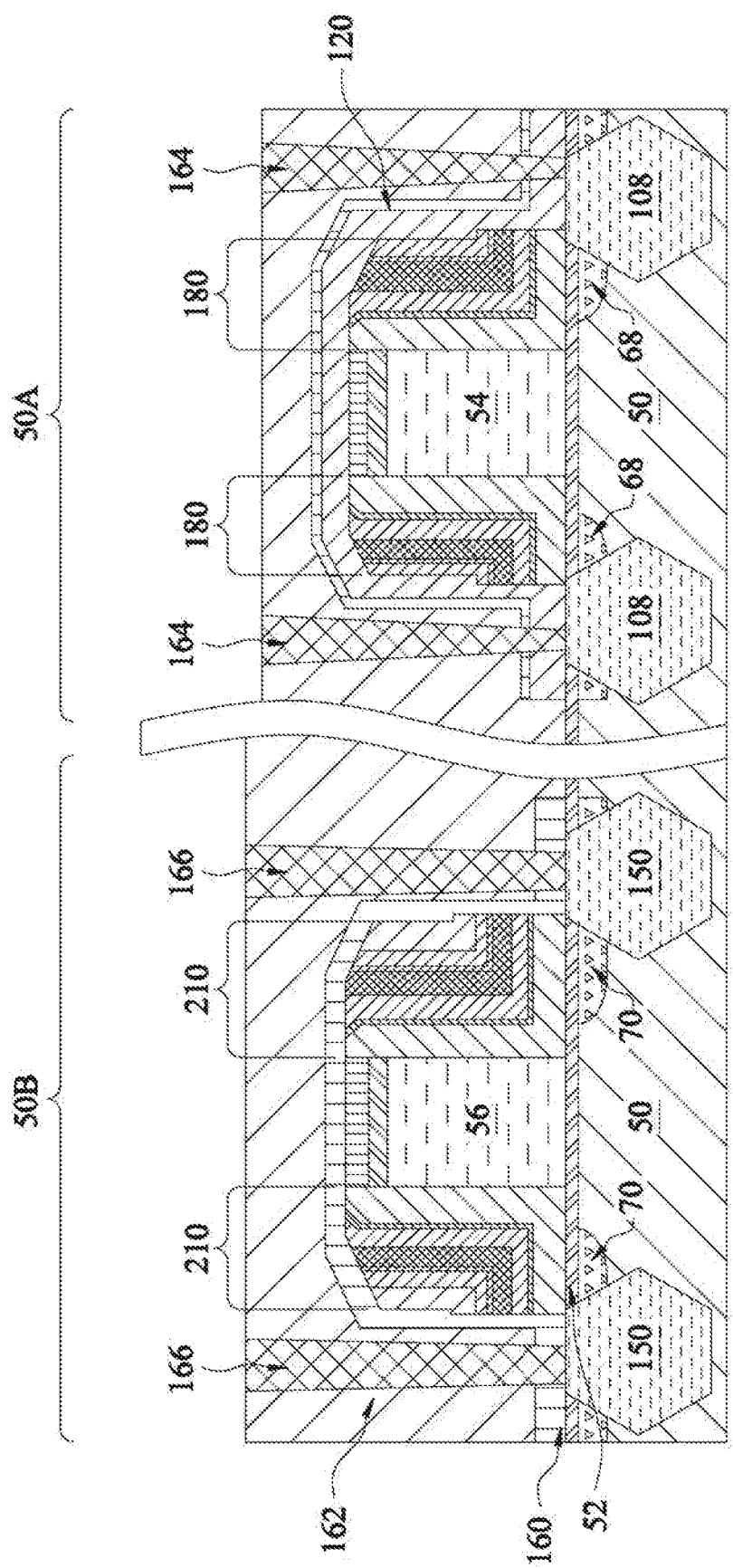

FIG. 30 illustrates structures after even further processing. An etch stop layer 160 is conformally formed over the substrate 50. The etch stop layer 160 is over the epitaxial source/drain regions 150, along the second gate spacers 210, and over the second gate stack in the second region 50B and is over the second dummy layer 120 in the first region 50A. The etch stop layer 160 may be silicon nitride, SiON, silicon carbonnitride (SiCN), a combination thereof, of the like, and may be deposited by CVD, ALD, or the like. An ILD 162 is deposited over the etch stop layer 160. The ILD 162 may be formed of a dielectric material such as PSG, BSG, BPSG, USG, or the like, and may be deposited by any suitable method, such as CVD, PECVD, FCVD, or the like. The ILD 162 may be planarized, such as by CMP.

Contacts 164 and 166 are formed through ILD 162, etch stop layer 160, and/or second dummy layer 120 to the epitaxial source/drain regions 108 and 150, respectively. Openings for contacts 164 and 166 are formed through the ILD 162, etch stop layer 160, and/or second dummy layer 120. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 162. The remaining liner and conductive material form contacts 164 and 166 in the openings. An anneal process may be performed to form a silicide at the interface between the epitaxial source/drain regions 108 and 150 and the contacts 164 and 166, respectively. Contacts 164 are physically and electrically coupled to the epitaxial source/drain regions 108, and contacts 166 are physically and electrically coupled to the epitaxial source/drain regions 150.

Although not explicitly shown, a person having ordinary skill in the art will readily understand that further processing steps may be performed on the structure in FIG. 30. For example, various Inter-Metal Dielectrics (IMD) and their corresponding metallizations may be formed over ILD 162.

Embodiments may achieve advantages. By passivating various surfaces of the gate spacers as discussed above, those surfaces may be more stable during an epitaxial growth process, such as to form the epitaxial source/drain regions. With more stable surfaces of the gate spacers, a precursor of an epitaxial growth process may be less likely to react with the gate spacers, which reaction could cause defects, e.g., selectivity loss defects, on the gate spacers that are difficult to remove by typical cleaning processes. Such selectivity loss defects may be atoms and/or molecules from, e.g., an epitaxy precursor that react with and form on the gate spacer. Embodiments may have fewer dangling bonds, with which the precursor may react, present on those surfaces of the gate spacers because of the passivation. Hence, embodiments may have fewer selectivity loss defects. As an example, a device may have a density of selectivity loss defects of about 0 defects/cm$^2$ present at an interface of a dielectric layer, such as the etch stop layer 160 in FIGS. 17 and 30, and an exterior surface of a gate spacer, such as gate spacers 90, 130, 180, and 210 in FIGS. 17 and 30.

A first embodiment is a method. The method includes forming a gate spacer along a sidewall of a gate stack on a substrate; passivating at least a portion of an exterior surface of the gate spacer; and epitaxially growing a material in the substrate proximate the gate spacer while the at least the portion of the exterior surface of the gate spacer remains passivated.

Another embodiment is a method. The method comprises forming an electrode on a substrate; forming a spacer along a sidewall of the electrode and treating at least a portion of an exterior surface of the spacer. The treating terminates the at least the portion of the exterior surface with a passivating species. The method further comprises forming a recess in the substrate proximate the spacer, and depositing a material in the recess while the at least the portion of the exterior surface is terminated with the passivating species.

A further embodiment is a structure. The structure comprises a substrate, a gate stack, a gate spacer, an epitaxial source/drain region, and a dielectric layer. The gate stack comprises a gate dielectric on the substrate and a gate electrode on the gate dielectric. The gate spacer is along at least a sidewall of the gate electrode. The epitaxial source/drain region is in the substrate proximate the gate spacer. The dielectric layer adjoins the gate spacer, and a surface of the gate spacer adjoining the dielectric layer has a density of selectivity loss defects of about 0 defects/cm$^2$.

An even further embodiment is a method. The method comprises forming a gate spacer along a sidewall of a gate stack on a substrate; terminating at least a portion of an exterior surface of the gate spacer with a terminating species; and while the at least the portion of the exterior surface of the gate spacer is terminated with the terminating species, epitaxially growing a semiconductor material in a recess in the substrate, the recess being proximate the gate spacer.

An even further embodiment is a method. The method includes forming an electrode on a substrate; forming a spacer along a sidewall of the electrode; treating at least a portion of an exterior surface of the spacer, the treating terminating the at least the portion of the exterior surface with a passivating species; forming a recess in the substrate proximate the spacer; depositing a material in the recess while the at least the portion of the exterior surface is terminated with the passivating species; and after depositing the material in the recess, removing the passivating species from the exterior surface of the spacer.

An even further embodiment is a method. The method includes forming an electrode on a substrate; depositing a first spacer layer along opposing sidewalls and a top surface of the electrode; performing a first passivation process on an exterior surface of the first spacer layer, the first passivation process terminating dangling bonds at the exterior surface of the first spacer layer with a first passivating species; after performing the first passivation process, depositing a second spacer layer over the first spacer layer; patterning the first spacer layer and the second spacer layer to form spacers on the opposing sidewalls of the electrode; patterning the substrate using the electrode and the spacers as a combined mask to form a recess in the substrate; performing a second passivation process on exterior surfaces of the spacers, the second passivation process terminating dangling bonds at the exterior surfaces of the spacers with a second passivating species; filling the recess with a semiconductor material; and after filling the recess with the semiconductor material, removing the second passivating species.

An even further embodiment is a method. The method includes forming an electrode over a substrate; depositing a first spacer layer along opposing sidewalls and a top surface of the electrode; forming a first monolayer on an exterior surface of the first spacer layer; depositing a second spacer layer over the first monolayer; patterning the first spacer layer, the first monolayer and the second spacer layer to form spacers on the opposing sidewalls of the electrode; etching the substrate using the electrode and the spacers as a combined etch mask to form a recess in the substrate; forming a second monolayer on exterior surfaces of the spacers; epitaxially growing a semiconductor material in the recess; and after epitaxially growing the semiconductor material in the recess, removing the second monolayer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an electrode on a substrate;
   forming a spacer along a sidewall of the electrode;
   treating at least a portion of an exterior surface of the spacer, the treating terminating the at least the portion of the exterior surface with a passivating species, the treating forming a monolayer along the exterior surface of the spacer, the monolayer comprising the passivating species, wherein forming the spacer comprises:
      conformally depositing a spacer layer along the electrode, the treating being performed on the spacer layer; and
      after the treating, etching the spacer layer to form at least a portion of the spacer, an exterior surface of a remaining portion of the spacer layer being a part of the exterior surface of the spacer;

forming a recess in the substrate proximate the spacer;

depositing a material in the recess while the at least the portion of the exterior surface is terminated with the passivating species; and after depositing the material in the recess, removing the passivating species from the exterior surface of the spacer.

2. The method of claim 1, wherein the passivating species comprises oxygen, fluorine, or a combination thereof.

3. The method of claim 1, wherein the treating comprises exposing the at least the portion of the exterior surface of the spacer to a thermal treatment.

4. The method of claim 1, wherein the treating comprises exposing the at least the portion of the exterior surface of the spacer to a plasma treatment.

5. The method of claim 1, wherein the treating comprises a wet treatment applied to the at least the portion of the exterior surface of the spacer.

6. The method of claim 1, wherein depositing the material in the recess comprises epitaxially growing a semiconductor material in the recess.

7. The method of claim 1, wherein a thickness of the monolayer is between about 3 Å and about 20 Å.

8. The method of claim 1, wherein removing the passivating species from the exterior surface of the spacer comprises performing a wet cleaning process.

9. A method comprising:

forming an electrode on a substrate;

depositing a first spacer layer along opposing sidewalls and a top surface of the electrode;

performing a first passivation process on an exterior surface of the first spacer layer, the first passivation process terminating dangling bonds at the exterior surface of the first spacer layer with a first passivating species;

after performing the first passivation process, depositing a second spacer layer over the first spacer layer;

patterning the first spacer layer and the second spacer layer to form spacers on the opposing sidewalls of the electrode;

patterning the substrate using the electrode and the spacers as a combined mask to form a recess in the substrate;

performing a second passivation process on exterior surfaces of the spacers, the second passivation process terminating dangling bonds at the exterior surfaces of the spacers with a second passivating species;

filling the recess with a semiconductor material; and after filling the recess with the semiconductor material, removing the second passivating species.

10. The method of claim 9, wherein the first passivating species comprises —O, —OH, —F, —Cl, or a combination thereof.

11. The method of claim 9, wherein the second passivating species comprises —O, —OH, —F, —Cl, or a combination thereof.

12. The method of claim 9, wherein the first passivation process comprises a wet treatment, a plasma treatment, a thermal treatment, or a combination thereof.

13. The method of claim 9, wherein the second passivation process comprises a wet treatment, a plasma treatment, a thermal treatment, or a combination thereof.

14. The method of claim 9, wherein the second passivation process forms a monolayer along the exterior surfaces of the spacers, the monolayer comprising the second passivating species.

15. A method comprising:

forming an electrode over a substrate;

depositing a first spacer layer along opposing sidewalls and a top surface of the electrode;

forming a first monolayer on an exterior surface of the first spacer layer;

depositing a second spacer layer over the first monolayer;

patterning the first spacer layer, the first monolayer and the second spacer layer to form spacers on the opposing sidewalls of the electrode;

etching the substrate using the electrode and the spacers as a combined etch mask to form a recess in the substrate;

forming a second monolayer on exterior surfaces of the spacers;

epitaxially growing a semiconductor material in the recess; and after epitaxially growing the semiconductor material in the recess, removing the second monolayer.

16. The method of claim 15, wherein the first monolayer comprises an oxide or a fluoride of a material of the first spacer layer.

17. The method of claim 15, wherein the second monolayer comprises an oxide or a fluoride of a material of the second spacer layer.

18. The method of claim 17, wherein the second monolayer further comprises an oxide or a fluoride of a material of the first spacer layer.

19. The method of claim 15, wherein removing the second monolayer comprises performing a wet cleaning process.

20. The method of claim 15, wherein the second monolayer extends along the top surface of the electrode.

* * * * *